United States Patent
Bedeschi et al.

(10) Patent No.: US 11,929,124 B2
(45) Date of Patent: Mar. 12, 2024

(54) METHOD AND SYSTEM FOR ACCESSING MEMORY CELLS

(71) Applicant: Micron Technology, Inc., Boise, ID (US)

(72) Inventors: Ferdinando Bedeschi, Biassono (IT); Riccardo Muzzetto, Arcore (IT); Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 17/597,004

(22) PCT Filed: Nov. 11, 2020

(86) PCT No.: PCT/IB2020/020074
§ 371 (c)(1),
(2) Date: Dec. 22, 2021

(87) PCT Pub. No.: WO2022/101655
PCT Pub. Date: May 19, 2022

(65) Prior Publication Data
US 2022/0351784 A1    Nov. 3, 2022

(51) Int. Cl.
*G11C 7/00*      (2006.01)
*G11C 16/08*    (2006.01)
(Continued)

(52) U.S. Cl.
CPC .............. *G11C 16/26* (2013.01); *G11C 16/08* (2013.01); *G11C 16/30* (2013.01); *G11C 29/52* (2013.01)

(58) Field of Classification Search
CPC .......... G11C 16/26; G11C 16/08; G11C 16/30; G11C 29/52
(Continued)

(56) References Cited

U.S. PATENT DOCUMENTS

2010/0259987 A1*  10/2010  Lee .................... G11C 16/16
                                                              365/185.17
2017/0125097 A1    5/2017  Tortorelli et al.
(Continued)

FOREIGN PATENT DOCUMENTS

KR    10-2017-0056242 A    5/2017

OTHER PUBLICATIONS

"International Search Report and Written Opinion of the International Searching Authority," issued in connection with Int'l Appl. No. PCT/IB2020/020074, dated Aug. 6, 2021 (9 pages).

*Primary Examiner* — Vu A Le
(74) *Attorney, Agent, or Firm* — Holland & Hart LLP

(57) ABSTRACT

The present disclosure relates to a method for accessing memory cells comprising: applying an increasing read voltage with a first polarity to the plurality of memory cells; counting a number of switching memory cells in the plurality based on the applying the increasing read voltage; applying a first read voltage with the first polarity based on the number of switched memory cells reaching a threshold number; applying a second read voltage with a second polarity opposite to the first polarity; and determining that a memory cell in the plurality of memory cells has a first logic value based on the memory cell having switched during one of the applying the increasing read voltage and the applying the first read voltage or based on the memory cell not having switched during the applying the second read voltage. A related system is also disclosed.

28 Claims, 13 Drawing Sheets

(51) Int. Cl.
    *G11C 16/26*     (2006.01)
    *G11C 16/30*     (2006.01)
    *G11C 29/52*     (2006.01)

(58) Field of Classification Search
    USPC .................................................. 365/189.011
    See application file for complete search history.

(56) References Cited

U.S. PATENT DOCUMENTS

| | | |
|---|---|---|
| 2017/0139628 A1 | 5/2017 | Yoon et al. |
| 2018/0138240 A1 | 5/2018 | Pellizzer |
| 2018/0350441 A1 | 12/2018 | Kim |
| 2019/0164601 A1 | 5/2019 | Na et al. |
| 2019/0198099 A1* | 6/2019 | Mirichigni .......... G11C 11/5678 |

\* cited by examiner

METHOD AND SYSTEM FOR ACCESSING MEMORY CELLS

CROSS REFERENCE

The present Application for Patent is a 371 national phase filing of International Patent Application No. PCT/IB2020/020074 by BEDESCHI et al., entitled "METHOD AND SYSTEM FOR ACCESSING MEMORY CELLS," filed Nov. 11, 2020, assigned to the assignee hereof, and expressly incorporated by reference herein.

DESCRIPTION

Technical Field

The present disclosure relates generally to operating an array of memory cells, and more particularly to a method and system for accessing memory cells.

Background

Memory devices are used in many electronic systems such as mobile phones, personal digital assistants, laptop computers, digital cameras and the like. Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Nonvolatile memories retain their contents when power is switched off, making them good choices in memory devices for storing information that is to be retrieved after a system power-cycle. In particular, non-volatile memory cells may maintain their stored logic state for extended periods of time even in the absence of an external power source. Volatile memory cells may lose their stored state over time unless they are periodically refreshed by an external power source.

Information is stored by programming different states of a memory device. For example, binary devices have two states, often denoted by a logic "1" or a logic "0." In other systems, more than two states may be stored. To access the stored information, a component of the memory device may read, or sense, the stored state. To store information, a component of the memory device may write, or program, the logic state.

Improving memory devices, generally, may include increasing memory cell density, increasing read/write speeds, increasing reliability, increasing data retention, reducing power consumption, reducing manufacturing costs, as well as scaling smaller than traditional devices (which may lead to relatively high rates of errors), and the like.

A more robust read technique may be desired to increase memory devices performances and reliability when memory cells exhibit variable electrical characteristics, in particular memory devices having a three-dimensional (3D) array of memory cells.

DETAILED DESCRIPTION

Figure 1:
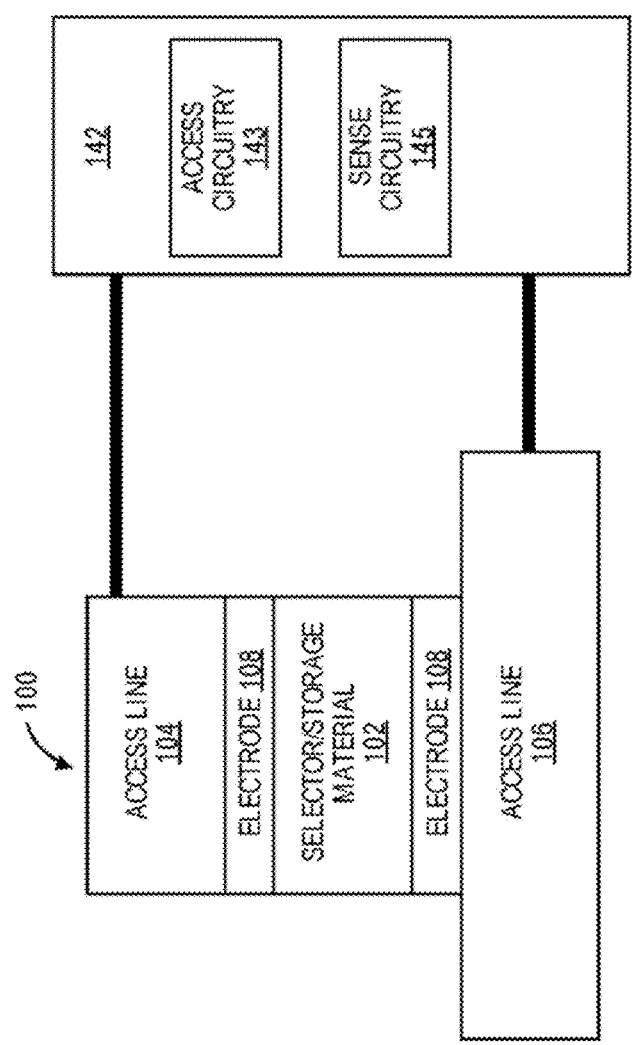
FIG. 1 illustrates a block scheme of a memory cell that can be read according to examples of the present disclosure.

With reference to those drawings, methods and systems for an improved reading operation of memory cells will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines. Flash memories are well established and well suited for mass storage applications; however, their performances do not meet present day most demanding applications. New technologies, for example 3D Cross Point (3DXPoint) memories and Self-Selecting Memories (SSM) have better performances, for example in terms of access time and access granularity (data may be programmed and read with page, word or—in principle—even bit granularity). Accessing data during a read operation is more and more challenging with scaled technologies.

The methods described in detail below (and corresponding systems) may comprise applying an increasing read voltage with a first polarity to a plurality of memory cells, for example an addressed codeword or page. The methods may also comprise counting a number of switching memory cells in the plurality based on the applying the increasing read voltage; for example, a mean estimator counter may be used in conjunction with sensing circuitry to detect and count switching events. The methods may further comprise applying a first read voltage with the first polarity based on the number of switched memory cells reaching a threshold number; for example, the reading voltage in the first polarity in increased by a predefined reading voltage difference to the first (maximum) read voltage in the first polarity. The methods may further comprise applying a second read voltage with a second polarity opposite to the first polarity; the second read voltage may have a same amplitude as an amplitude of the first read voltage or it may have a higher amplitude than the amplitude of the first read voltage. The methods may further comprise determining that a memory cell in the plurality of memory cells has a first logic value based on the memory cell having switched during one of the applying the increasing read voltage and the applying the first read voltage or based on the memory cell not having switched during the applying the second read voltage.

The disclosed methods may be applied in conjunction with data manipulation and/or encoding, for example balanced encoding. An adaptive read sequence is disclosed, that accurately tracks statistical threshold voltage variations and possible drifts of actual memory cells being addressed during the lifetime of the memory device. As it will be evident, the disclosed methods and systems exhibit better performance and increased reliability than known reading methods and systems.

FIG. 1 illustrates one example of a memory cell that can be arranged in an array and then programmed and read according to the present disclosure. In the example illustrated in FIG. 1, the memory cell 100 includes a storage material 102 between access lines 104 and 106. The access lines 104, 106 electrically couple the memory cell 100 with circuitry 142 that writes to and reads the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one example, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to the access circuitry 143. Access circuitry can store information in the memory cell 100 by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one example, the memory cell 100 is a self-selecting memory cell that includes a single layer of material that acts as both a selector element to select the memory cell and a memory element to store a logic state.

In one example, the storage material 102 is a phase change material. A phase change material can be electrically switched between a generally amorphous and a generally crystalline state across the spectrum between completely amorphous and completely crystalline states. In another example, the storage material 102 is not a phase change material. In one example in which the storage material 102 is not a phase change material, the storage material is capable of switching between two or more stable states without changing phase. In one such example, the access circuitry 143 programs the memory cell 100 by applying a voltage with a particular polarity to cause the storage material 102 to be in the desired stable state.

In one such example, programming the memory cell 100 causes the memory cell 100 to "threshold" or undergo a "threshold event." When a memory cell switches (e.g., during a program voltage pulse), the memory cell undergoes a physical change that causes the memory cell to exhibit a certain threshold voltage in response to the application of a subsequent voltage (e.g., a read voltage with a particular magnitude and polarity). Programming the memory cell 100 can therefore involve applying a voltage of a given polarity to induce a programming threshold event, which causes the memory cell 100 to exhibit a particular threshold voltage at a subsequent read voltage of a same or different polarity. In one such example, the storage material 102 is a self-selecting material (e.g., a non-phase change chalcogenide material or other self-selecting material) that can be programmed by inducing a threshold event.

As is explained in further detail below, in one example, the output of such a memory cell when read differs as a function of the polarity used to program the memory cell and the polarity used to read the memory cell. For example, in one example, the storage material 102 exhibits a "lower threshold voltage" or a "higher threshold voltage" in response to a read voltage pulse based on the polarity of both the programming and read voltages. In one example, exhibiting a threshold voltage means that there is a voltage across the memory cell that is approximately equal to the threshold voltage in response to the application of a voltage with a particular magnitude and polarity to the terminals of the memory cell. The threshold voltage thus corresponds to the minimum voltage to be applied at the input(s) to produce output(s), i.e. to see a determined electrical response of the cell. In other words, in the context of the present disclosure, the verb "threshold" means that the cells undergo a threshold event, i.e. they have an electrical response in response to the applied voltage that is above a given threshold, thus exhibiting a peculiar threshold voltage. For example, a cell may draw no or negligible current when biased at a voltage lower than its threshold voltage and it can draw a considerable current after it is biased at its threshold voltage.

As mentioned above, the access lines 104, 106 electrically couple the memory cell 100 with circuitry 142. The access lines 104, 106 can be referred to as bitlines and wordlines, respectively. The wordline is for accessing a particular word in a memory array and the bitline is for accessing a particular bit in the word. The access lines 104, 106 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one example, electrodes 108 are disposed between storage material 102 and access lines 104, 106. Electrodes 108 electrically couple access lines 104, 106 with storage material 102. Electrodes 108 can be composed of one or more conductive and/or semiconductive materials such as, for example: carbon (C), carbon nitride (CxNy); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one example, conductive wordline layer can include any suitable metal including, for example, metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

Referring again to the circuitry 142, the access lines 104, 106 communicatively couple the circuitry 142 to the memory cell 100, in accordance with an example. The circuitry 142 includes access circuitry 143 and sense circuitry 145, in accordance with an example. Circuitry includes electronic components that are electrically coupled to perform analog or logic operations on received or stored information, output information, and/or store information. Hardware logic is circuitry to perform logic operations such as logic operations involved in data processing. In one example, the access circuitry 143 applies voltage pulses to the access lines 104, 106 to write to or read the memory cell 100. The terms "write" and "program" are used interchangeably to describe the act of storing information in a memory cell. In one example, to write to the memory cell 100, the access circuitry applies a voltage pulse with a particular magnitude and polarity to the access lines 104, 106, which can both select memory cell 100 and program memory cell 100.

In one example, the access circuitry 143 applies a pulse with one polarity to program the memory cell 100 to be in one logic state, and applies a pulse with a different polarity to program the memory cell 100 to be in a different logic state. The access circuitry 143 can then differentiate between different logic states as a consequence of the programming polarity of a memory cell. For example, in a case of a memory read, in one example, the access circuitry 143 applies a voltage pulse with a particular magnitude and polarity to the access lines 104, 106, which results in an electrical response that the sense circuitry 145 can detect. Detecting electrical response, sometime referred to as threshold voltage, can include, for example, detecting one or more of: a voltage drop across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100 based on electrical responses to one or more of the voltage pulses in the read sequence. Other examples can include memory cells having additional or different layers of material than illustrated in FIG. 1 (e.g., a thin dielectric material between the storage material and access lines).

The electric current generated upon application of a reading voltage thus depends on the threshold voltage of the memory cell determined by the electrical resistance of the logic state storage element (the resistance of other elements, such as access lines, electrodes, access/sense circuitry, etc., may be considered constant). For example, a first logic state (e.g., SET state) may correspond to a finite amount of current, whereas a second logic state (e.g., RESET state) may correspond to no current or a negligibly small current. Alternatively, a first logic state may correspond to a current higher than a current threshold, whereas a second logic state may correspond to a current lower than the current threshold.

Figure 2:
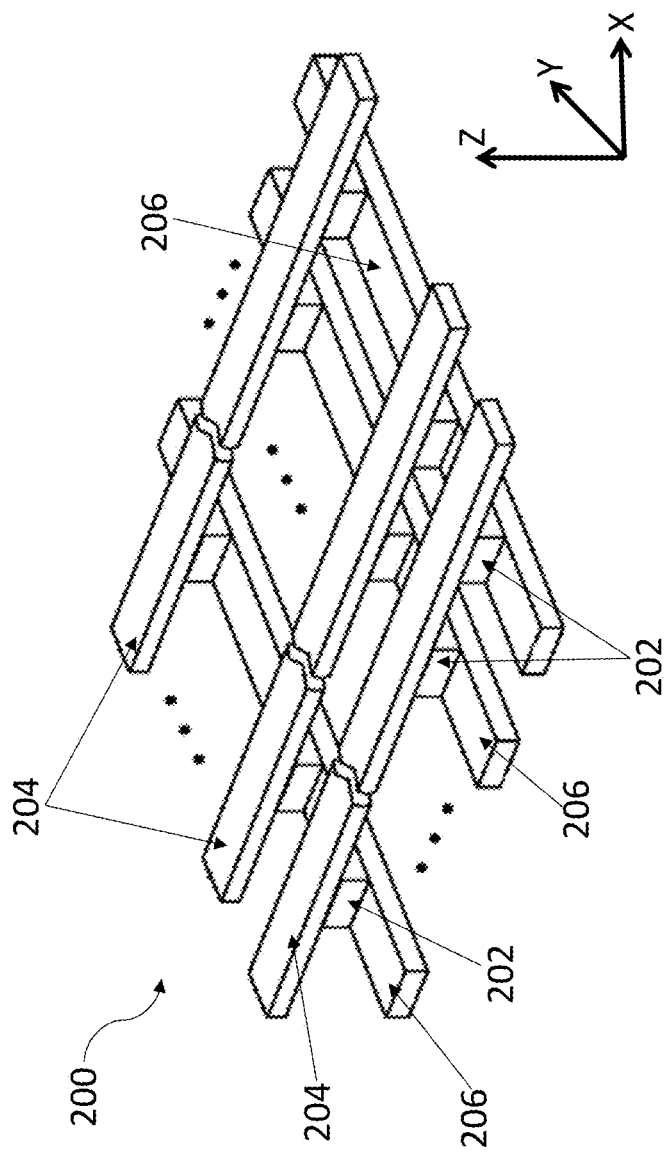
FIG. 2 schematically illustrates a portion of a memory cell array according to examples of the present disclosure.

FIG. 2 illustrates a portion of a memory cell array 200, which can include a memory cell such as the memory cell 100 of FIG. 1, in accordance with an example. Memory cell array 200 is an example of a three-dimensional (3D) cross-point memory structure. The memory cell array 200 includes a plurality of access lines 204, 206, which can be the same or similar as the access lines 104, 106 described with respect to FIG. 1. Access lines 204, 206 can be referred to as bitlines and wordlines. In the example illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. In one example, a "cross-point" is formed at an intersection between a bitline, a wordline. A memory cell is created from the storage material 202 between the bitline and wordline where the bitline and wordline intersect. The storage material 202 can be a chalcogenide material such as the storage material 102 described above with respect to FIG. 1. In one example, the access lines 204, 206 are composed of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction).

A "cross-point" thus refers to a place where a memory cell is formed such that access lines associated with the memory cell topologically "cross" each other as access lines connect to different nodes of the memory cell. Cross-point architecture enables reaching the theoretical minimum cell area determined by the minimum pitch of access lines.

FIGS. 1 and 2 illustrate an example of a memory cell and array. However, other memory cell structures and arrays may be used, in which the memory cells exhibit electrical responses that vary as a function of programming and read polarity. A memory cell (not shown) may be formed at crossing locations between vertical conductive pillars, acting as bitlines, intersecting horizontal conductive planes, acting as wordlines, in a 3D memory array, for example. This and other array organizations may also lead to a cross-point architecture as described above.

Ideally, the memory cells of a memory device may feature a same (nominal) resistivity and therefore a same threshold voltage for a same logic state, wherein the threshold voltage is the voltage to be applied to the memory cells for causing them to conduct an electric current, i.e. the minimum value of the voltage that is needed to create a conducting path between the terminals, as above defined. However, since different cells programmed to a same logic state practically exhibit different resistivity values because of several factors (such as for example variations in the electrical characteristics of the phase-change material caused by the execution of a number of read-write operations and/or by manufacturing tolerances), each logic state is actually associated to a respective resistivity distribution (typically a Gaussian-type distribution), and therefore to a respective threshold voltage distribution.

In order to assess the logic state of a cell, a reading operation is carried out to assess which threshold voltage distribution the threshold voltage of the cell belongs to. For example, a reading voltage may be applied to the cell via access lines and the logic state of the cell is assessed based on (the presence or absence of) a current responsive to said reading voltage, the (presence or absence of the) current depending on the threshold voltage of the cell. A cell thresholds (e.g., it becomes conductive) when a suitable voltage difference is applied between its two terminals; such a voltage difference may be obtained in different ways, for example biasing one terminal, such as a wordline terminal, to a negative voltage (e.g. a selection voltage), and the other terminal, such as a bitline terminal, to a positive voltage (e.g. a reading voltage). Other biasing configurations may produce the same effects (e.g., both the word line and the bitline terminal biased to positive voltage, or the wordline terminal biased to a reference voltage, e.g. a ground voltage, and the bitline terminal biased to a positive voltage).

In other words, operations such as reading and writing, which may be referred to as access operations, may be performed on memory cells by activating or selecting a wordline 206 and bitline 204. As known in the field, wordlines 206 may also be known as row lines, sense lines, and access lines. Bitlines 204 may also be known as digitlines, column lines, data lines, as well as access lines. References to wordlines and bitlines, or their analogues, are interchangeable without loss of understanding or operation. For example, the access lines may be wordlines and the data lines may be bitlines. Wordlines 206 and bitlines 204 may be perpendicular (or nearly perpendicular) to one another to create an array, as previously shown with reference to FIG. 2. Depending on the type of memory cell (e.g., FeRAM, RRAM, etc.), other access lines (not shown in the figures) may be present, such as plate lines, for example. It may be appreciated that the exact operation of the memory device may be altered based on the type of memory cell and/or the specific access lines used in the memory device. Activating or selecting a wordline 206 or a bitline 204 may include applying a voltage to the respective line via a dedicated driver. By activating one wordline and one bitline, a storage material 202 of a single memory cell may be accessed at their intersection. Accessing the memory cell may include reading or writing the memory cell.

Accessing memory cells may be controlled through a row decoder and a column decoder (not shown). For example, a row decoder may receive a row address from a memory controller and activate the appropriate wordline based on the received row address. Similarly, a column decoder may receive a column address from the memory controller and activate the appropriate bitline.

As mentioned before, in some cases, storage materials 202 of memory cells may exhibit different electrical characteristics after a number of cycling operations (e.g., a series of read or write operations). For example, a threshold voltage of a storage material 202 of a memory cell (e.g., PCM cell or a SSM cell) corresponding to a logic state of 1, after receiving an identical programming pulse to store the logic state of 1 (e.g., a SET programming pulse), may be different if a memory cell has been cycled a relatively small number of read or write operations compared to a memory cell having been cycled through an extensive number of read or write operations. In addition, in some cases, a chalcogenide material in the memory cells (e.g., the logic storage element 102 or 202) may experience a change (which may also be referred to as a drift) in its resistance after programming (e.g., crystallizing or quenching) of the chalcogenide material during a write operation. Such change in resistance may result in changes in threshold voltages of memory cells and may hinder accurately reading information from memory cells after a certain period of time elapsed. In some examples, the amount of change may be a function of ambient temperature. Additionally, some intrinsic process variability (lot-to-lot, wafer-to-wafer, wafer position-to-wafer position, and even within the same memory array) is unavoidable. Such process variations add to the usage variations mentioned above, resulting in a distribution of electrical characteristics, threshold voltage, for example, that may lead to errors. In many cases, it may be impractical to rely on error correction mechanisms to handle the errors. It is rather preferable to adopt a solution that may, at least in part, track such variations in an adaptive way.

The present disclosure provides a robust and reliable read technique also when memory cells (e.g., PCM cells or SSM cells) exhibit different, non-uniform, variable electrical characteristics that may originate from various factors including statistical process variations, cycling events (e.g., read or write operations on the memory cells), or a drift (e.g., a change in resistance of a chalcogenide alloy), among others, as described above.

More in particular, according to the memory cell read techniques of the present disclosure, the reading of a set of user data (e.g., a plurality of memory cells, such as a codeword, a page, etc.) is performed with a first positive (or negative) read voltage and a second negative (or positive) read voltage; an increasing read voltage with the first polarity may be initially also applied. The increasing read voltage may be a staircase voltage or ramped voltage; in some cases, the increasing voltage may have a variable slew rate. A mean estimator or a counter (e.g. counting N/2, where N is the minimum number of cells or bits in the first logic state, e.g., logic value 1) triggers an extra voltage step $\Delta V_{R1}$ at the end of the increasing voltage ramp (e.g., at mean estimator voltage $V_{ME}$, when the number of switched memory cells reaches a threshold number, corresponding to a fraction of the cells programmed in the first logic state: N/2, for example) to reach the first read voltage (e.g., Vmax). The second read voltage with a same (e.g., −Vmax) or similar (e.g., −Vmax−$\Delta V_{R2}$) amplitude is applied to determine the logic state of cells for which it has not been already determined.

The combination of the increasing read voltage with the mean estimator allows tracking of any possible threshold variation on statistical basis. For example, memory cells in a codeword likely have less dispersion that the entirety of the memory cell in a memory device. Similarly, highly cycled memory cells or cells with similar time lapsed from last access may have similar threshold voltage drift. Adaptively identifying the mean threshold voltage (e.g., 50% of switched cells) at codeword or page level may allow to greatly reduce the otherwise very large margin that would be useful to account for all statistical variations on the entirety of the memory cell population. An adaptive first read voltage can then be applied based on the mean estimator voltage (e.g., the amplitude of the increasing voltage for which the number of switched memory cells reaches the threshold number). The adaptive amplitude (Vmax) of the first read voltage may be sufficiently low and it may allow for some of the cells programmed in the first logic value not to be correctly identified at this stage, and rather be correctly identified during the second read voltage with the opposite polarity (e.g., at −Vmax or at −Vmax—delta) and/or corrected by an Error Correction Code engine. The present disclosure may thus determine a total number of memory cells associated with a given logic state through a very effective reading operation, providing a new, more efficient and reliable solution based on the proposed method for reading memory cells, in particular in 3D memory devices.

Figures 3A, 3B:
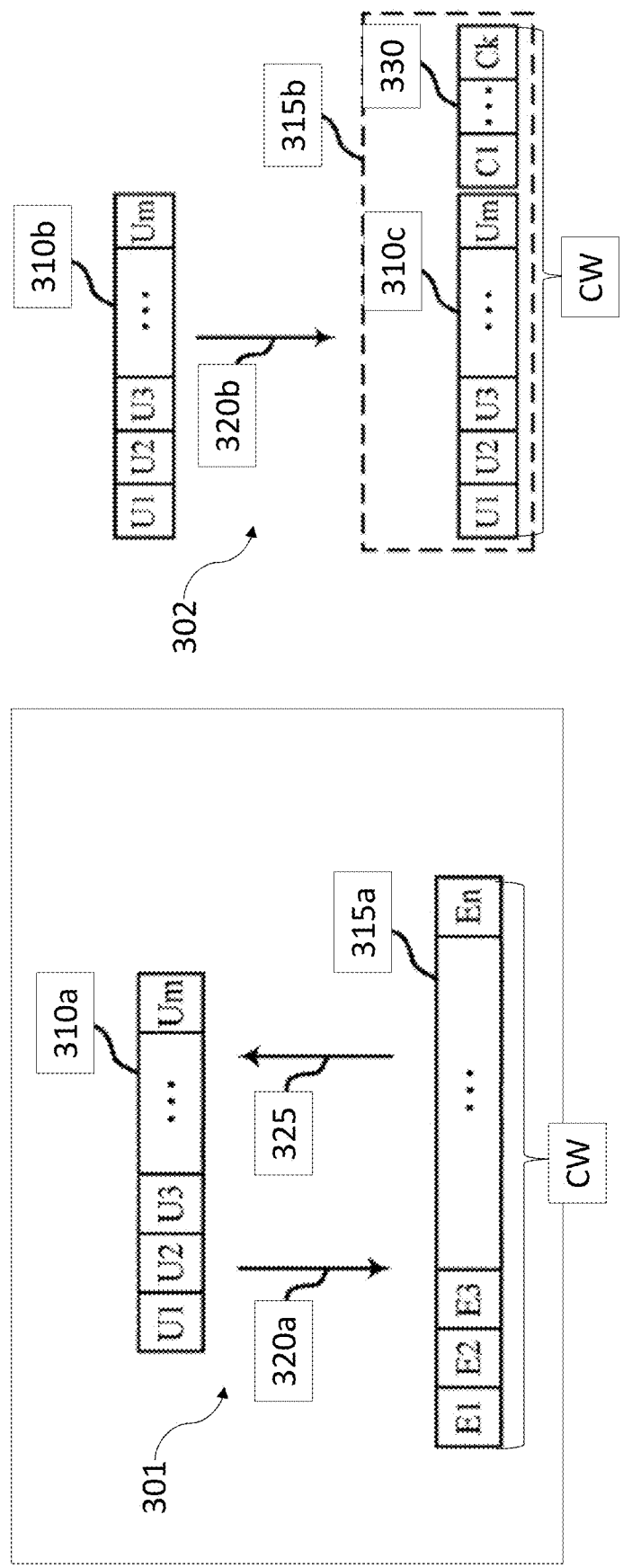
FIGS. 3A and 3B illustrate examples of data patterns according to examples of the present disclosure.

FIG. 3A illustrates a user data pattern diagram 301. The user data pattern diagram 301 includes user data 310a and encoded user data 315a. Encoding process 320a, which is performed in the programming phase of the array of memory cells, may convert the user data 310a into the encoded user data 315a. The encoded user data 315a may be stored in a set of memory cells, which may be, for example, memory cells described with reference to FIGS. 1 and 2. Each box of the encoded user data 315a may correspond to a memory cell that may exhibit a logic state/value of 1 or a logic state/value of 0. During the encoding process 320a, a number of user data bits 310a may be flipped (e.g., the logic value associated to the encoded user data bit is different than the original user data bit—for example, it is inverted). For example, the user data bits 310a may be divided in subsets that are selectively flipped until a desired number of bits in a given logic state is obtained; for example, 50% (or approximately 50%) of the bits are encoded in memory cells with a logic state 1 and the remaining 50% (or approximately 50%) of the bits are encoded in memory cells with a logic state 0).

A number of parity bits may be added to the user data 310a to track which of the user data bits have been flipped in the codeword or page. Patch bits may be further added to exactly achieve the target percentage of cells or bits in the desired logic state. The encoding process 320a may account for the bits of the user data 315a (including the additional parity bits, e.g., both inversion bits and possible patch bits) to be programmed in the desired logic state at the target percentage (e.g., 50%). It should be noted that, not explicitly shown in FIG. 3A, if an Error Correction Code (ECC) engine is available to protect the user data, additional bits (that may also be referred to as parity bits) may be used. The ECC parity bits may either be considered as part of the user data 310a (e.g., [U1, U2, . . . , Um] before the encoding process 320a) or added during encoding process 320a (e.g., included in an encoded codeword associated with the user data 315a [E1, E2, . . . , En]); in any case, the desired target percentage of memory cells of the codeword, including ECC parity bits, may be programmed in the desired logic state. Accordingly, an encoded user data codeword is formed with a predetermined number of cells or bits of the encoded user data 315a having a given logic value (e.g., a logic value of 1). As a result, a number of bits in the encoded user data 315a may be greater than the number of bits in the user data 310a (e.g., n is larger than m if some bits, e.g. parity bits, are added).

Process 325 may convert the encoded user data 315a back to the user data 310a after the encoded user data 315a have been accurately read.

In an example, the plurality of encoded bits to be read represents a codeword (CW). The codeword could include various information to be used during the reading phase. In other words, after the memory cells in the plurality of memory cells (e.g., the encoded codeword or encoded page) have been correctly read, the determined pattern (1 or 0 logic value in respective memory cells) allows to reconstruct the original user data pattern by reversing the flipping operation carried out during the encoding process.

In some examples, for each set of user data 310a, corresponding encoded user data 315a may have a same number of memory cells exhibiting a logic state of 1 and a logic state of 0 (which may also be referred to as a balanced encoding scheme, where half of the encoded user data bits have a logic value of 1, and the other half have a logic value of 0). As such, the encoded user data may be referred to have a 50% weight. In some examples, for each user data 310a, corresponding encoded user data 315a may have a predetermined number of memory cells exhibiting a given logic state (e.g., a logic state of 1), hence producing a constant weight that may be different than 50% (which may also be referred to as a constant weight encoding scheme). In general, an outcome of the encoding process 320a may be that a predetermined number of memory cells exhibiting a given logic state (e.g., a logic state of 1) in the encoded user data 315a is established.

In other words, according to an example of the present disclosure, the codeword may be manipulated to constrain the number of bits exhibiting a given logic value (e.g. a logic value of 1) to a known desired predetermined value, generally between a minimum value and a maximum value, by adding some extra bits of information. Therefore, in some examples, the memory cells of the array may be configured to store encoded user data that include modified user data (or original user data, in some cases) and a number of bits which may be added thereto, i.e. a data manipulation is performed to constrain the number of bits having a preterminal logic value (e.g. the number of 1s) in a codeword by few (e.g. 2-4) parity or inversion bits. In this way, the statistics of the codeword is improved by using distributions having a reasonable number of bits in a given logic value, in particular having a predetermined number of bits having a logic value 1, or having a number of bits having a logic value of 1 in a given range, facilitating the reading operation and avoiding extreme cases with very few bits exhibiting the first logic value. This also allows to statistically track usage (e.g. drift and cycling) of the codeword with few extra bits, as well as improving speed.

In the context of the present disclosure, a bit having the logic value of 1 (e.g. corresponding to a cell in the logic state 1) is identified as a bit in a first logic state, whereas a bit having the logic value of 0 (e.g. corresponding to a cell in the logic state 0) is identified as a bit in a second logic state, even if other definitions may be used.

Therefore, the present disclosure provides, in the programming phase, the storage of user data (such as the encoded user data 315a) in a plurality of memory cells of the memory array, said data being subjected to encoding schemes as previously described. More in particular, the user data may be encoded in a codeword having a predetermined number of bits exhibiting the first logic value. For example, in an example, the encoded user data may have a same number of bits having the logic value of 1 and the logic value of 0, i.e. the encoded user data have substantially a same number of bits exhibiting the first logic value and the second logic value, even if other configurations in which the encoded user data have a known predetermined number of bits in the first logic value may be used.

In some examples, methods and systems of the present disclosure may use a codeword portion, i.e. a counter, having bits protected with ECC and/or with other mechanisms. A set of memory cells of the array is thus configured to store user data, while an additional set of memory cells is configured to store counting information in the counter. In an example, the counting information may represent a number of bits in the user data having the logic state of 1. The counting information is hereinafter referred to as count data.

FIG. 3B illustrates an example of user data pattern diagram 302 that supports the memory cell read techniques of the present disclosure. The user data pattern diagram 302 includes user data 310b and encoded data 315b. Encoding process 320b may encode the user data 310b into the encoded data 315b. The encoded user data may include the user data 310c in addition to count data 330. In some examples, user data 310c may be the same as user data 310b (e.g., the user data [U1, U2, U3, . . . , Um] is unchanged and count data 330 include information about how many bits or cells are in the predetermined logic state. Alternatively (not depicted in FIG. 3B), as already discussed with reference to FIG. 3A, an encoding scheme may include manipulating user data to constrain the number of bits exhibiting a given logic value (e.g. a logic value of 1) to a known desired predetermined value or within a predetermined range and adding a number of extra bits (which may also be referred to as parity bits or inversion bits) to the user data during the encoding process, so that the encoded user data 310c may be different from the starting user data 310b as a result of process 320b.

In some examples, an encoding scheme is used to store counting information in the form of count data corresponding to a total number of bits in the user data having a given logic state (e.g., a logic state of 1) in a number of memory cells 330 (e.g., a codeword or page counter). The counting information may be stored as a binary number that represents the total number of bits in the user data having the given logic state. In other cases, the counting information may be encoded to have a weight pattern of a given weight (e.g., 20%, 30%, 50%, i.e. one-half of the memory cells storing the counting information have the given logic state, 75% and the like), as it will be detailed in the following. In some cases, the encoding scheme may result in the total number of bits in the user data having a given logic state (e.g., a logic state of 1) being in a predetermined weight range (e.g., 48%-50%, 40%-48%, 40%-45%, or 20%-25%, for example) rather than an exact predetermined weight. Some additional bits, or patch bits, may be programmed to obtain an exact weight, in some cases.

In an example, the number of memory cells of the count data 330 may be determined by a length of the user data 310c. In some cases, the count data 330 includes k memory cells when the user data is $2^k$ bits long. In other cases, the count data 330 may include 2×k memory cells when the user data is $2^k$ bits long. In other words, k may be the number of bits used to obtain a balanced code with a $2^k$ codeword length, wherein often the number of bits having the value 1 is maintained in a given interval [x; $2^k/2$] with a lower number of extra bits than k.

In some examples, during the encoding process 320b, a total number bits having a given logic value (e.g., a logic value of 1) of the user data 310c may be identified and said total number may be stored in the count data 330 (e.g., as a binary number). As an example, when the user data 310c is 16 bits long (e.g., $2^4$ bits long) and has 9 bits out of 16 bits having a logic state of 1, the count data 330 is 4 bits long and corresponds to a binary number 1001. In other examples, during the encoding process 320b, the total number of bits exhibiting a given logic value (e.g., a logic value of 1) of the user data 310c may be identified and the total number may be encoded in the count data 330 by converting each digit of the binary number (e.g., 1001) to a pair of digits (e.g., a binary digit of 1 to 10 and a binary digit of 0 to 01). Using the same example described above, when the user data 310c is 16 bits long (e.g., $2^4$ bits long) and has 9 bits (e.g., a binary number of 1001) exhibiting a logic value of 1, the count data 330 may be 8 bits long and correspond to 10010110. Such an encoding provides the count data 330 to have a balanced weight of 50%, as will be discussed also in the following.

An outcome of the encoding process 320b may thus be that a known number of memory cells having a given logic state (e.g., a logic state of 1) in the user data 310c is established and then stored in the count data 330. In any case, according to the present disclosure, the value stored in the codeword or page counter may be used to accurately read the user data 310c.

Therefore, the present disclosure provides storing in a counter (e.g., a codeword or page counter), associated with the array of memory cells, information (i.e. the count data) corresponding to a total number of bits in the user data having a given logic value (e.g., the first logic value of 1).

As mentioned above, an example of the present disclosure provides for balancing the counter in such a way that it comprises a known predetermined number of bits having the first logic value. In other words, the counter may be manipulated with extra bits of information so that it comprises a controlled number of bits having a given logic value (e.g. a controlled number of bis having the first logic value 1). As an example, the counter may have a 50% balanced scheme (as shown previously), or it may have another predetermined fixed number of bits having the first logic value 1 different from 50%.

Encoding (e.g., balanced encoding) allows to obtain a preset value (e.g., half of the total number of bits in the user data having the given logic value, such as the first logic value 1) during the application of an increasing read voltage of a first polarity to the plurality of addressed memory cells. When, counting a number of switching memory cells the number of switched memory cells reaches a threshold number (at an adaptive mean estimator reading voltage $V_{ME}$ during the reading operation) the reading voltage is increased by a predetermined read voltage difference $\Delta V_{R1}$ to a first read voltage of the first polarity (e.g., Vmax). In other words, in some examples, a mean estimator associated with the array of memory cells counts a number of switching memory cells while applying an increasing read voltage. Based on a certain number of read triggers (e.g., N/2 cells switching, where N is the minimum number of cells expected in the first logic value 1). When the preset number of memory cells having the first logic value is read, an extra voltage step is triggered to reach the first read voltage (e.g., Vmax) in the first polarity. The first read voltage (Vmax) is based on the adaptive mean estimator read voltage $V_{ME}$, so it is also adapted to the memory cells being read; in practice the first reading voltage tracks any statistical variation associated to the memory cells being specifically addressed. The adaptive amplitude (Vmax) of the first read voltage may be sufficiently low and it may allow for some of the cells programmed in the first logic value not to be correctly identified at this stage, and rather be correctly identified by application of a the second read voltage with the opposite polarity (e.g., at −Vmax or at −Vmax−$\Delta V_{R2}$) and/or corrected by an Error Correction Code engine, as explained in more detail below.

Figure 4A:
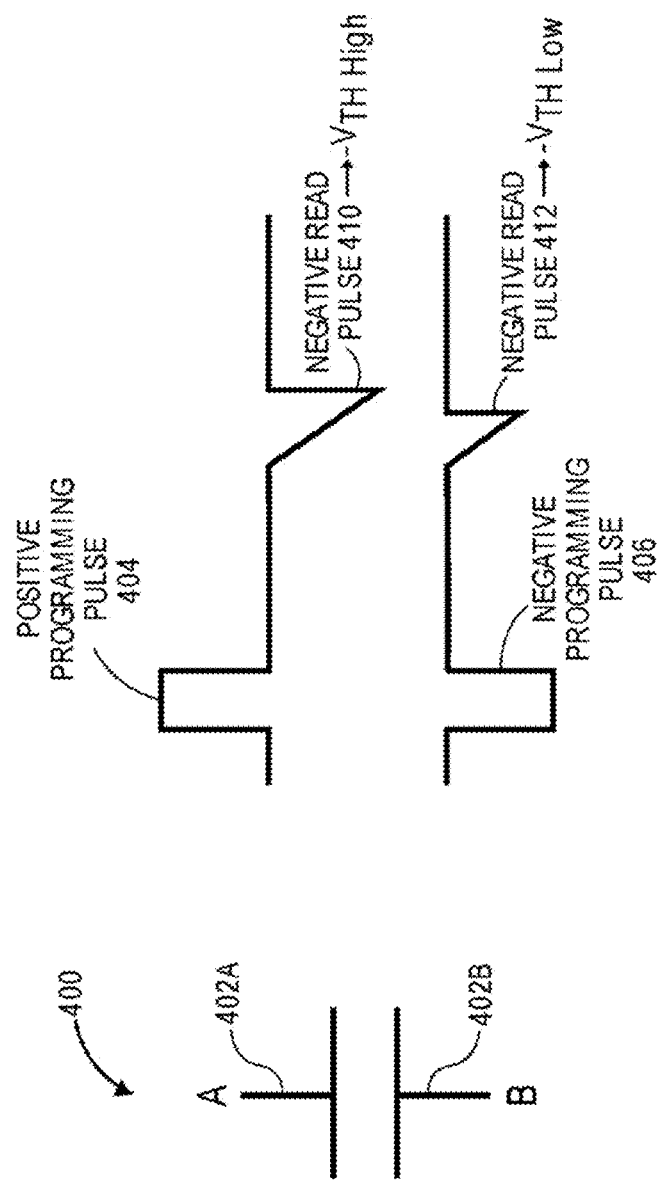
FIG. 4A illustrates a read of a memory cell according to examples of the present disclosure.
Figure 4B:
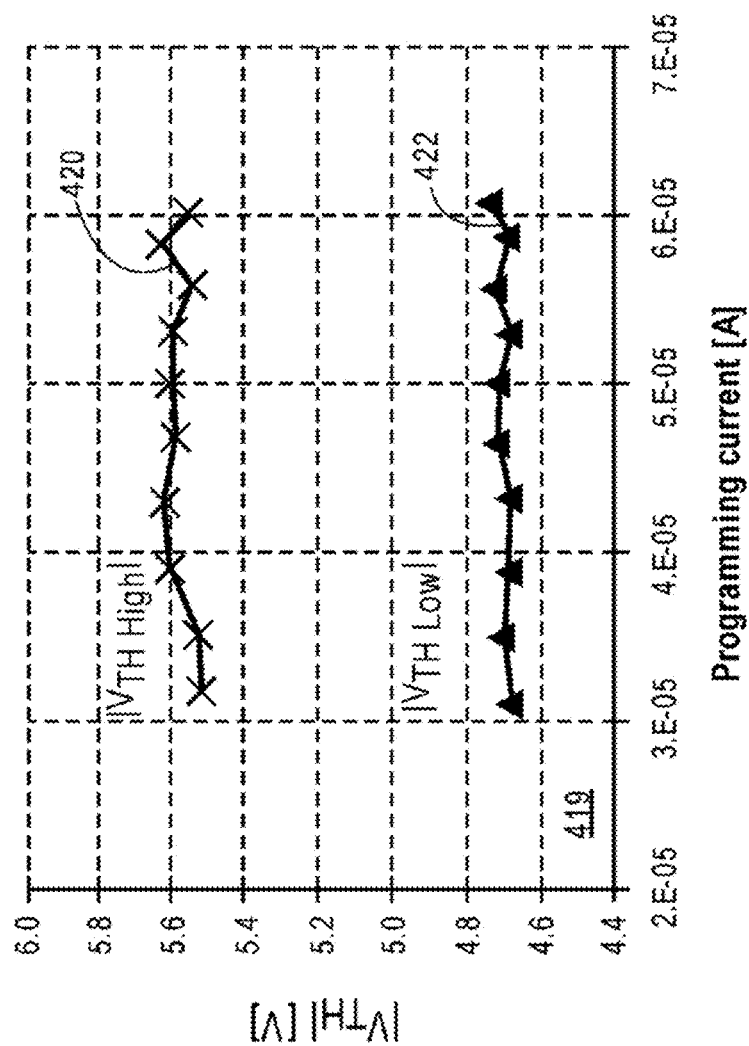
FIG. 4B is a graph of experimental data showing lower and higher threshold voltages exhibited by a memory cell according to examples of the present disclosure.

FIGS. 4A and 4B illustrate how the polarity of programming and read voltage pulses can affect the threshold voltage exhibited by a memory cell such as the memory cell 100 of FIG. 1, in accordance with examples. FIG. 4A is a diagram illustrating a single-polarity read of a memory cell, in accordance with an example. FIG. 4B is a graph illustrating threshold voltages with lower and higher magnitudes, in accordance with an example.

Referring to FIG. 4A, a memory cell 400 has terminals 402A, 402B (labeled A and B, respectively) for accessing the memory cell 400. In one example, terminals A and B are access lines, such as the access lines 104 and 106 of FIG. 1 or access lines 204 and 206 of FIG. 2. Access circuitry (such as the access circuitry 143 referred to in FIG. 1) can write to or read the memory cell 400 by applying a voltage having a particular magnitude and polarity to the terminals 402A, 402B of the memory cell, in accordance with examples. For example, FIG. 4A shows a "positive" programming pulse 404 and a "negative" programming pulse 406. A positive programming pulse refers to a programming pulse with "positive polarity," which can also be referred to as "forward polarity." A negative programming pulse is a voltage pulse with "negative polarity," which can also be referred to as "reverse polarity." In one example, whether or not a programming pulse is positive or negative is based on the relative voltages applied to the terminals 402A, 402B. A voltage pulse can be defined as positive if the voltage applied to one of the terminals is more positive than the voltage applied to a second of the terminals. For example, referring to FIG. 4A, a positive voltage pulse can include: a positive voltage applied to terminal 402A and a negative voltage applied to terminal 402B; a positive voltage applied to terminal 402A and 0 V (e.g., circuit ground or neutral reference) applied to terminal 402B; 0V applied to terminal 402A and a negative voltage applied to terminal 402B, a positive voltage applied to both terminals 402A and 402B, but where the voltage applied to 402A is greater than the voltage applied to 402B (e.g., the magnitude of the positive voltage applied to 402A is higher than the magnitude of the positive voltage applied to 402B); or a negative voltage applied to both terminals 402A and 402B, but where the voltage applied to 402A is greater than the voltage applied to 402B (e.g., the magnitude of the negative voltage applied to 402A is less than the magnitude of the negative voltage applied to 402B).

In such an example, a voltage pulse applied to the terminals of the memory cell would be negative if the voltage applied to terminal 402A is more negative than the voltage applied to terminal 402B. For example, a negative voltage pulse can include: a negative voltage applied to terminal 402A and a positive voltage applied to terminal 402B; a negative voltage applied to terminal 402A and 0 V (e.g., circuit ground or neutral reference) applied to terminal 402B; 0V applied to terminal 402A and a positive voltage applied to terminal 402B, a negative voltage applied to both terminals 402A and 402B, but where the magnitude of the voltage applied to 402A is greater than the magnitude of the voltage applied to 402B; or a positive voltage applied to both terminals 402A and 402B, but where the magnitude of the voltage applied to 402B is greater than the magnitude of the voltage applied to 402A.

FIG. 4A shows a particular definition of "positive" and "negative" relative to terminals 402A, 402B for illustrative purposes, however, examples can define positive and negative differently. For example, an example can define a positive programming pulse to be a voltage pulse in which the voltage applied to terminal 402B is more positive than the voltage applied to terminal 402A.

As mentioned above, in one example, access circuitry can both write to and read a memory cell by applying a voltage with a particular magnitude and polarity to the cell. In one example, access circuitry can write different values or logic states to the memory cell by applying voltages with different polarities. For example, the access circuitry can apply a positive programming pulse (e.g., positive programming pulse 404) to write one logic state, and a negative programming pulse (e.g., negative programming pulse 406) to write a different logic state. For ease of reference, the following description refers to a positive programming pulse as writing a "logic value 1" to memory cell and a negative programming pulse as writing a "logic value 0" to a memory cell, although a different convention can be adopted. For example, in one example, access circuitry can apply a negative programming pulse to write a logic value 1 and a positive programming pulse to write a logic value 0.

In one example, whether or not a voltage applied to a memory cell programs the cell depends upon the magnitude and duration of the applied voltage. For example, in one example, access circuitry applies a programming pulse, such as the programming pulse 404 or 406, with a magnitude sufficient to cause the memory cell to threshold. For example, in one example, the access circuitry can apply a voltage with a magnitude that is greater than or equal to the highest expected threshold voltage exhibited by the memory cell. In some examples the duration of a programming voltage pulse is 10 ns-50 ns. In some examples, the duration of the programming voltage pulse is 1-100 ns. In some examples, the duration of the programming voltage pulse is 1 ns-1 µs. In one example, the duration of programming pulses and read pulses is the same.

Different examples can involve applying read and write voltage pulses of different shapes. In the example illustrated in FIG. 4A, the programming pulses 404 and 406 are shown as box-shaped pulses (also known as rectangular-shaped or square-shaped pulses), and the read pulses 410, 412 are shown as ramped pulses. In one example, the read pulses 410, 412 ramp up or down to a read voltage magnitude (e.g., to $-V_{TH\ High}$ and $-V_{TH\ Low}$ in the example illustrated in FIG. 4A). In actual implementations, the voltage pulses may have leading or trailing edges, in accordance with examples. Other examples can apply write and read pulses having shapes such as triangular (e.g., ramped pulses), trapezoidal, rectangular, box, and/or sinusoidal shapes. Thus, circuitry for accessing memory cells can apply programming pulses having a variety of shapes and durations sufficient to cause the memory cells to threshold into the desired state.

One method of reading memory cells involves applying a voltage pulse to the memory cell with a single polarity. For example, FIG. 4A shows an example of a single-polarity read. In one such example, access circuitry applies a voltage pulse with only a single particular polarity to the memory cells. Sense circuitry can detect the electrical response of a given memory cell to the single-polarity pulse. In the example illustrated in FIG. 4A, reading the memory cell 400 involves applying a negative voltage pulse, such as negative read pulses 410 and 412. Although FIG. 4A illustrates negative read pulses 410, 412, access circuitry can also perform a single-polarity read using only positive voltage pulses to perform a single-polarity read.

In one example, if the read voltage pulse has a different polarity than the programming pulse, such as in the case of positive programming pulse 404 and negative read pulse 410, the memory cell exhibits a threshold voltage with a higher magnitude ($-V_{TH\ High}$). In one such example, if the read voltage pulse has the same polarity as the programming pulse, the memory cell exhibits a threshold voltage with a lower magnitude ($-V_{TH\ Low}$). In the example illustrated in FIG. 4A, the polarity of the resulting threshold voltage is negative because the read voltage pulses are negative. Thus, in accordance with an example, when performing single polarity reads, the memory cell exhibits a threshold voltage with a higher magnitude (e.g., $|-V_{TH\ High}|$) when the memory cell is in one logic state, and a threshold voltage with a lower magnitude ($|-V_{TH\ Low}|$) when the memory cell is in another logic state. Access circuitry can thus determine the logic state of a given cell based on whether the memory cell exhibits a higher or lower magnitude threshold voltage. For example, applying an increasing voltage ramp in a first polarity (negative polarity according to the example depicted in FIG. 4A) between terminals 402A and 402B may result in the memory cell switching at a lower or higher threshold voltage depending on the programmed state of the cell.

FIG. 4B is a graph 419 showing threshold voltages with a higher and lower magnitude, in accordance with an example. The graph 419 includes experimental data (threshold voltages) collected from memory cells in response to application of different programming currents. Thus, the x-axis of the graph 419 is the magnitude (absolute value) of the programming current and the y-axis of the graph 419 is the magnitude (absolute value) of the resulting threshold voltage in response to the programming current. As mentioned above, depending upon the programming and read polarities, the threshold voltage magnitude exhibited by a memory cell will be higher (e.g., $V_{TH\ High}$) or lower (e.g., $V_{TH\ Low}$). The graph 419 in FIG. 4B shows that the memory cells exhibit the higher and lower threshold voltages for a range of programming currents. The graph 419 also shows that the higher and lower threshold voltages are actually ranges of voltages. For example, the higher threshold voltage magnitudes 420 are a range of magnitudes clustered at approximately 5.6V in the illustrated example. Similarly, the lower threshold voltage magnitudes 422 are a lower range of magnitudes approximately centered around 4.7V in the illustrated example. The threshold voltage ranges comprise intrinsic threshold voltage statistical variations of each individual cell (e.g., time-to-time variations in reading conditions, drift associated to time lapsed from last access and/or cumulated number of accesses, etc.) as well cell-to-cell variations (for example, due to local non-uniformities during the manufacturing process, cell's position with respect to signal drivers, etc.). The ranges of lower and higher threshold voltage magnitudes are separated by a window.

The window between the ranges of threshold voltage magnitudes can affect the ability to reliably write to and read the memory cells. According to one example, if the window between the threshold voltage ranges is sufficiently large (e.g., if the ranges of threshold voltages are sufficiently spaced apart), then access circuitry may be able to reliably distinguish between a logic 1 and 0 in response to a single-polarity read. For example, if the threshold voltage ranges are sufficiently spaced apart, access circuitry may be able to accurately read the memory cell by applying a single read voltage approximately at a mid-point between the low and high threshold voltages (e.g., about 5.1V in the example illustrated in FIG. 4B). In one such example, applying a single read voltage (e.g., Vmax) at the mid-point between the low and high threshold voltages would cause memory cells programmed with the negative programming pulse 406 to threshold, but not the memory cells programmed with the positive programming pulse 404. Accordingly, access circuitry could distinguish the logic state of the memory cells by determining which memory cells switched (e.g., thresholded) in response to the single read voltage. However, if the window between the threshold voltage ranges is small, or if the threshold voltage ranges overlap, it can be difficult to reliably distinguish between a logic 1 or 0 with a single-polarity read.

Figure 5:
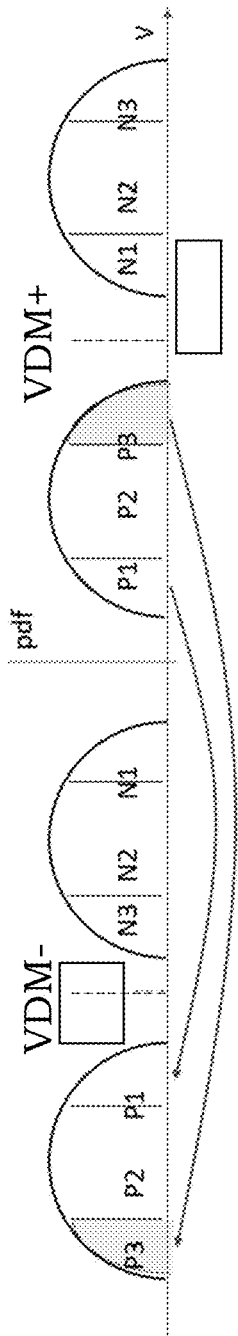
FIG. 5 is a diagram illustrating a hypothesis on various cell distributions according to examples of the present disclosure.

In one example, a double-polarity read sequence enables correctly reading values stored in memory cells even when the threshold voltage distributions overlap, in accordance with an example. FIG. 5 is a diagram illustrating various cell distributions in accordance with an example of the present disclosure. The distributions shown and described below in the present disclosure is used to intuitively indicate whether the distributions of the memory cells with different logic states overlap.

As shown in FIG. 5, sector 501 illustrates the distribution of threshold voltage magnitudes in response to a positive polarity read (for instance positive voltage), in accordance with an example. The sector 503 illustrates the distribution of threshold voltage magnitudes in response to a negative polarity read (for instance negative voltage), in accordance with an example. For illustrative purposes, FIG. 5 adopts a particular programming convention that assumes access circuitry applies a positive programming pulse (P) to program a cell to a logic 1, and a negative programming pulse (N) to program the cell to a logic 0. However, another example can adopt the opposite programming convention (e.g., a positive programming pulse can result in a logic 0 and a negative programming pulse can result in a logic 1). In other words, as described with reference to FIGS. 3 and 4, a cell programmed with a positive pulse has a threshold voltage that is distinguished from the threshold voltages associated to a cell programmed with a negative pulse, independently of the polarity of the reading pulse. In general, a memory cell exhibits a low (in absolute value) threshold voltage when it is read with the same polarity as the polarity of programming pulse, while the memory cells exhibits a high (in absolute value) threshold voltage when read in a polarity different than (e.g., opposite to) the polarity of the programming pulse. As described above, due to statistical variations, the threshold voltages of positively programmed cells may result in a distribution (P) that—only for the purpose of the following explanation—may be conceptually divided in portions P1, P2 and P3. Similarly, the threshold voltages of negatively programmed cells may result in a distribution (N) that—for clarity—may be conceptually divided in portions N1, N2 and N3. More or less portions may be conceived, without loss of generality.

As shown in FIG. 5, for example, P1, P2, and P3 may indicate three portions of the threshold voltage distribution corresponding to memory cells programmed to be, for instance, logic 1, and N1, N2, and N3 may indicate three portions of the threshold voltage distribution corresponding to memory cells programmed to be, for instance, logic 0. When reading the memory cells in a positive polarity, for example, with a positive voltage, the portions of distributions have threshold voltages (positive voltages): P1<P2<P3<N1<N2<N3. Contrarily, when reading the memory cells in a negative polarity, for example, with a negative voltage, the portions of distributions have threshold voltages (negative voltages): |P3|22 |P2|>|P1|>|N3|>|N2|>|N1|. Therefore, if the read is made in the positive polarity, a read voltage VDM+ may be selected to be greater than the expected highest threshold voltage of the memory cells programmed to be logic 1 and lower than the expected lowest threshold voltage of the memory cells programmed to be logic 0, and if the read is made in the negative polarity, a read voltage VDM− may be selected to have a magnitude (in absolute value) greater than the expected highest threshold voltage magnitude of the memory cells programmed to be logic 0 and lower than the expected lowest threshold voltage magnitude of the memory cells programmed to be logic 1. In this case, the memory cells can be read correctly.

However, in fact, the distributions of the threshold voltages of the memory cells programmed to be different logic states may be not completely separated without any overlaps as shown in FIG. 5. Therefore, in order to improve the window budget, especially close to the tails of the distributions, a more effective reading method of memory cells is proposed in the present disclosure, which will be described in detail with respect to FIGS. 6-9 below.

Figure 6A:
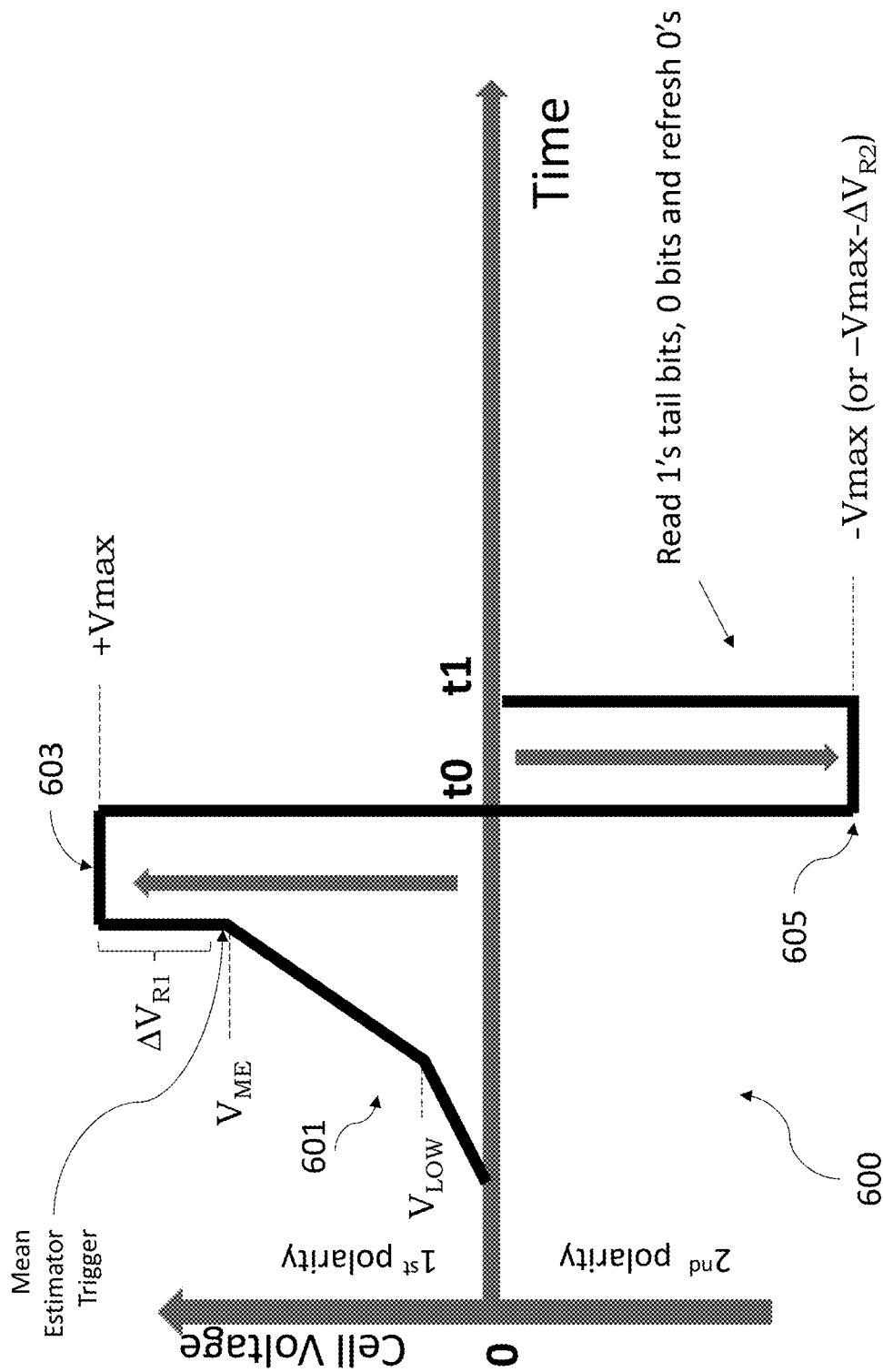
FIGS. 6A and 6B illustrate read sequences of memory cells according to examples of the present disclosure.
Figure 6B:
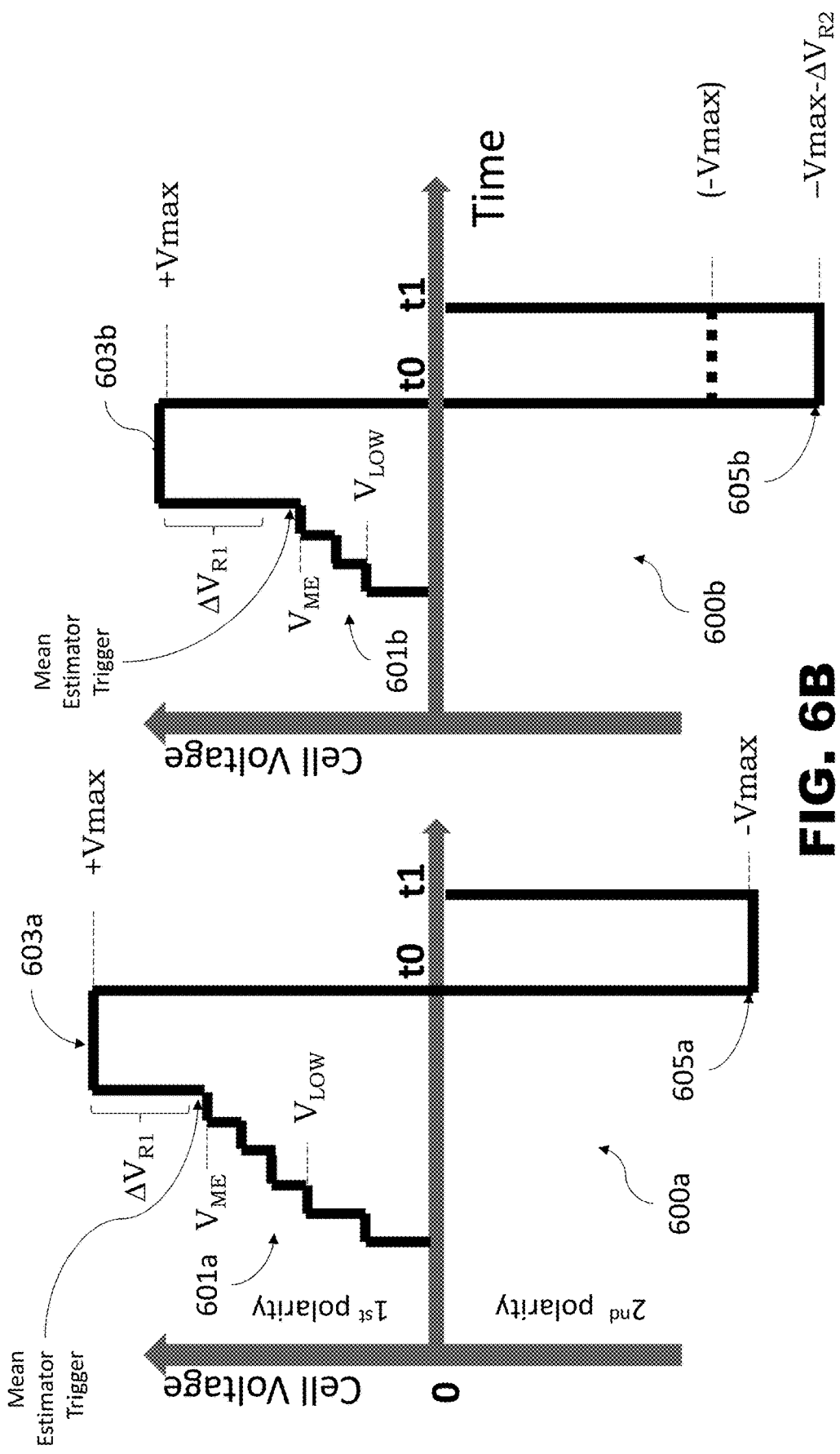
Figure 7:
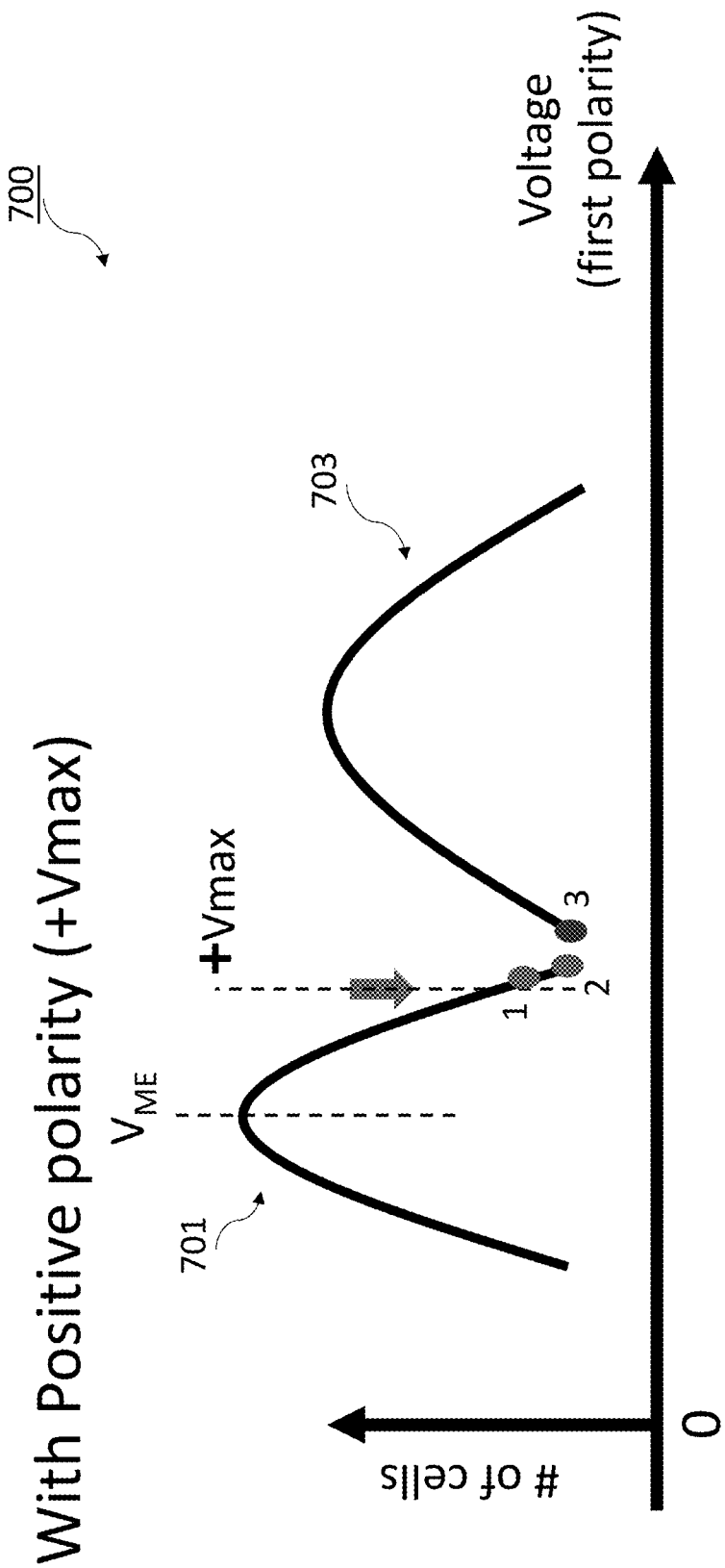
FIG. 7 is a diagram illustrating memory cell distributions during a read with a read voltage of a first polarity according to examples of the present disclosure.
Figure 8:
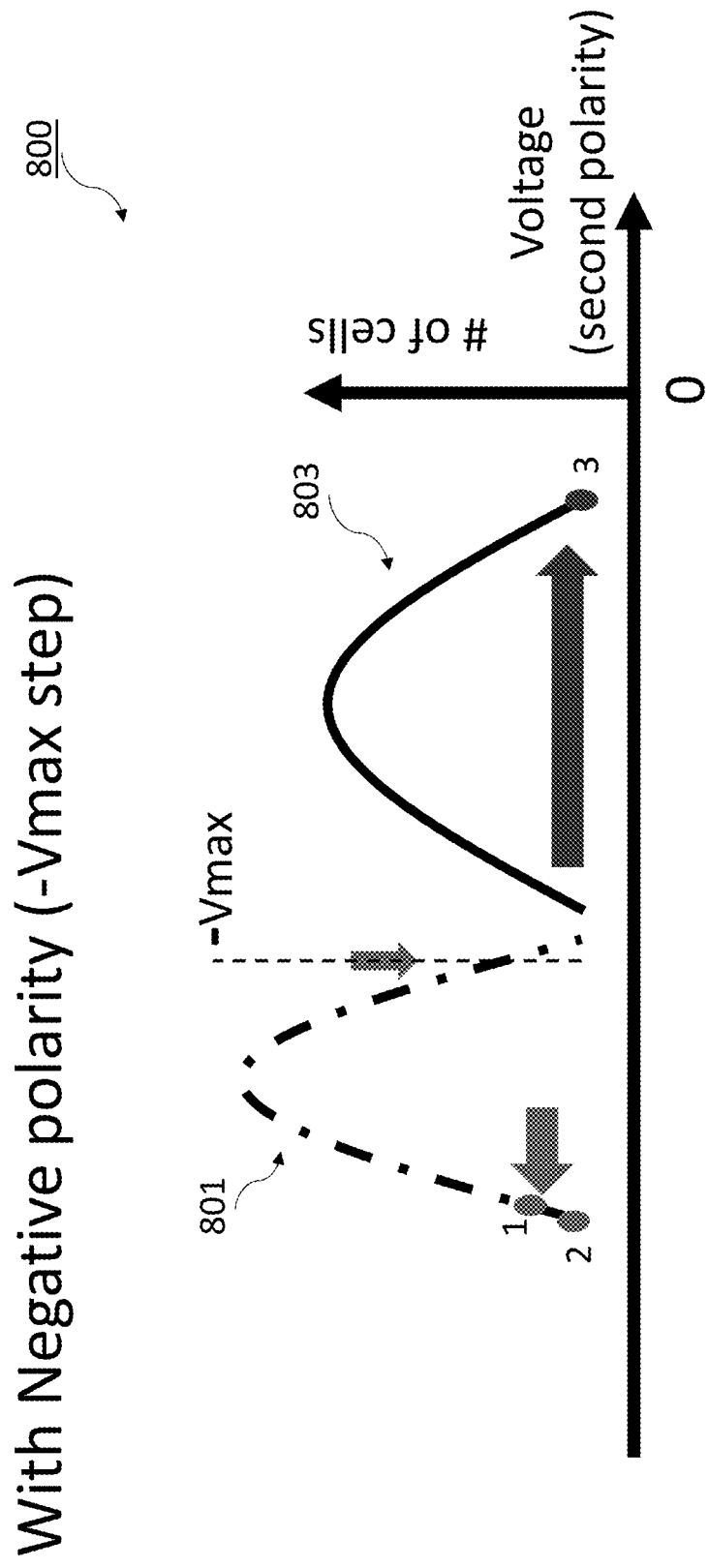
FIG. 8 is a diagram illustrating cell voltage distributions during a read with a read voltage of a second polarity according to examples of the present disclosure.
Figure 9:
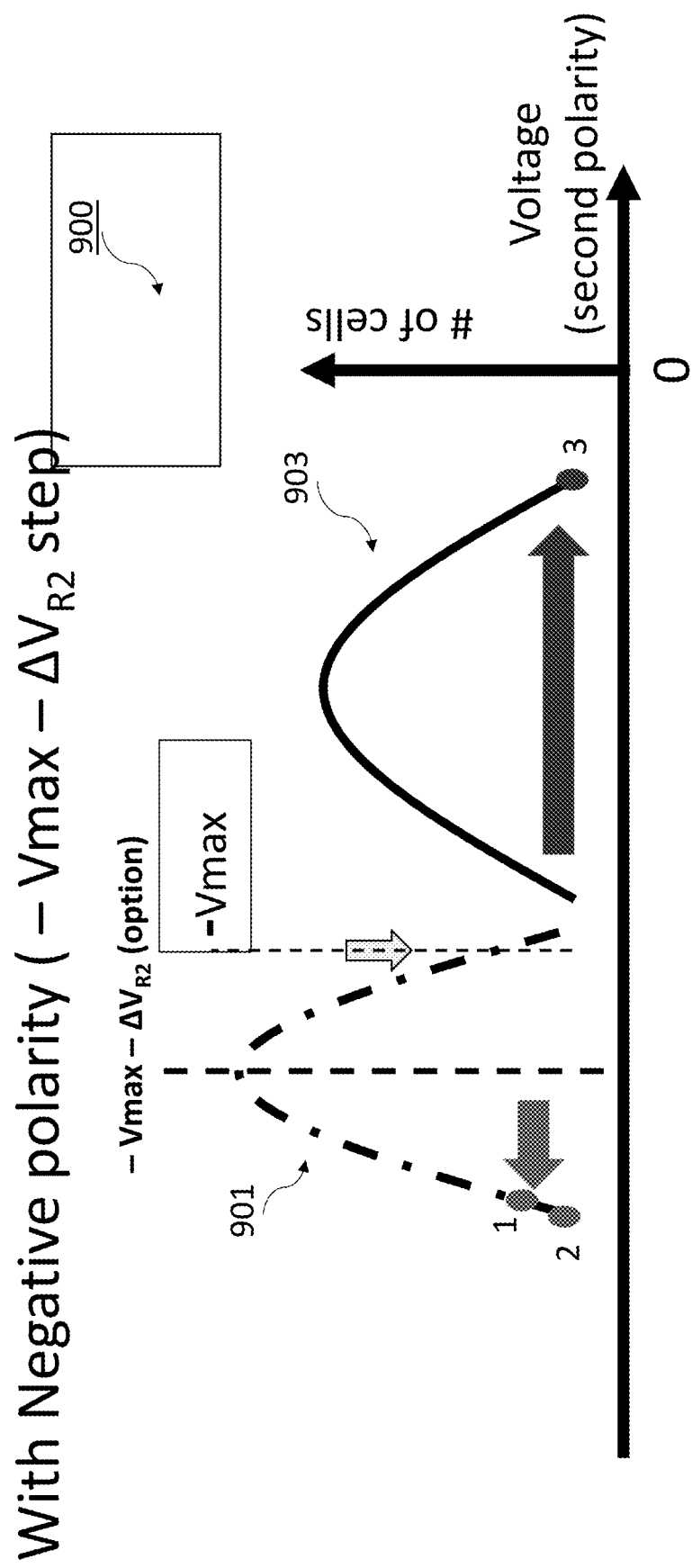
FIG. 9 is a diagram illustrating cell voltage distributions during another read with a read voltage of a second polarity according to examples of the present disclosure.

FIG. 6A illustrates a read sequence 600 of memory cells, which is to be used in the reading of FIGS. 7-9, according to examples of the present disclosure. FIG. 6B illustrates additional or alternative read sequences according to the present disclosure. In the description of FIGS. 6A and 6B it is normally assumed that the plurality of memory cells, e.g., the addressed codeword or page, has been encoded according to one of the techniques described above; for example, the codeword has a balanced number of bits or cells in a predetermined logic state (e.g., logic value 1). However, claimed subject matter is not so limited and all considerations may apply even to a sole memory cell.

As shown in FIG. 6A, the read sequence 600 may include an increasing read voltage 601 (e.g., a positive voltage ramp that may have a variable slew-rate, as depicted), a first read voltage 603 (e.g., +Vmax) after a mean estimator has met a threshold number of memory cells having switched, and a second read voltage 605 (e.g., -Vmax or -Vmax-$\Delta V_{R2}$).

The read sequence 600 may start with an increasing read voltage 601 during which memory cells with threshold voltage in the lower end of the distribution switch. As indicated in FIG. 6A, when the mean estimator is evaluated counting a certain number of read triggers, e.g., at mean estimator voltage $V_{ME}$, corresponding to the number of switched cells having reached N/2, where N is the number of memory cells expected to be in the first logic value 1, the read voltage may be increased from $V_{ME}$ by the predetermined read voltage difference $\Delta V_{R1}$ to first read voltage 603, e.g., +Vmax. In one example, a first read with a positive voltage may end at t0, and at the same time, a first set of data read from the memory cells during the increasing voltage ramp 601 and the first read voltage 603 may be latched.

The read voltage may then be inverted to a negative voltage (e.g., -Vmax or, optionally, -Vmax-$\Delta V_{R2}$) to perform a second read voltage 605 with the negative polarity. The second read may end at t1 and a second set of data read from the memory cells during the second read may be latched. Considering the description above with reference to FIG. 5, memory cells switching when biased at the second read voltage 605 with the negative polarity are assigned a logic value 0 and memory cells not switching when biased at the second read voltage 605 are assigned a logic value 1.

In summary, it is determined that a memory cell has a first logic value (e.g., logic 1) based on the memory cell having switched during application of one of the increasing read voltage 601 and the first read voltage 603 or based on the memory cell not having switched during the application of the second read voltage 605. As a result, memory cells that are in the first logic state (e.g., logic state 1) have been read correctly, including the first set of data and the second set of data, and at the same time, memory cell that are in the second logic state (e.g., logic state 0) may be refreshed.

FIG. 6B illustrates additional or alternative read sequences according to the present disclosure. More specifically, read sequences 600a and 600b are examples wherein applying the increasing read voltage comprises applying a voltage staircase ramp and wherein the mean evaluator voltage ($V_{ME}$) and the second read voltage (Vmax) have different values, as explained below. Several aspects of sequences 600a and 600b are the same or similar to the corresponding ones of read sequence 600 described with reference to FIG. 6A; for conciseness, in the following description such same or similar aspects will not described again in detail.

As mentioned above, read sequence 600a comprises an initial step of applying an increasing read voltage 601a in a first polarity (a positive polarity is depicted, but all polarities may be exchanged in other examples. The increasing read voltage may be applied as a staircase voltage ramp with variable slew rate. A counter counts the number of memory cells thresholding during the application of the increasing read voltage 601a. In the depicted example the read voltage is increased in steps (two steps are shown) up to $V_{Low}$. $V_{Low}$ may be a voltage at which the first memory cell in the plurality of addressed memory cell switches (e.g., the threshold voltage of the memory cell is lower than $V_{Low}$). The staircase ramp may have a relatively high slew rate up to this point to save time in exploring a reading voltage range where no or very few memory cells switch. The slew rate of following steps (three steps are shown) is lower to allow for a more precise sampling of the voltage range and detection of mean evaluator voltage $V_{ME}$.

Mean evaluator voltage $V_{ME}$ may be a voltage at which a target number of memory cell programmed in a predetermined logic state have switched (for example 50% of the memory cells programmed at logic value 1). Thresholded memory cells, e.g., memory cells with threshold voltage lower than $V_{ME}$ are assigned a logic value 1. Upon the count number meeting the threshold number, the read voltage is increased by a read voltage difference $\Delta V_{R1}$ to first read voltage 603a, e.g., +Vmax up to time t0. Memory cells with threshold voltage lower than Vmax threshold, e.g., switch, and are assigned a logic value 1. Polarity of the read voltage is inverted and second read voltage 605a -Vmax (e.g., with same amplitude than first read voltage 603a) is applied till time t1. In line with description of FIG. 5, memory cells with threshold voltage (measured in negative polarity) higher than |-Vmax| in absolute value are assigned a logic value 1 while memory cells with threshold voltage lower (in absolute value) than |-Vmax| as measured in negative polarity, e.g., cells thresholding when second read voltage 605a is applied, are assigned a logic value 0.

Read sequence 600b is similar to read sequence 600a, however, a shorter portion of the initial increasing read voltage 601b staircase ramp is depicted (a sole step of relatively higher amplitude is sufficient to reach the voltage value $V_{LOW}$ at which the first memory cell threshold. Moreover, two steps at the lower slew rate during the increasing read voltage staircase ramp 601b are depicted to represent that in read sequence 600b the switched cells counter of mean estimator matches the threshold number count of switched memory cells at a voltage $V_{ME}$ lower than during read sequence 600a. The above is indicative of the actual threshold voltage distribution of memory cells addressed in read sequence 600b being generally at lower voltages than corresponding distribution of cells addressed in read sequence 600a. This fact may help to understand the benefits of the disclosed solution(s), according to which the read voltage is increased by read voltage difference $\Delta V_{R1}$ to first read voltage 603a, e.g., +Vmax up to time t0. Therefore, the first read voltage (603, 603a, 603b) is adaptive to the specific threshold voltage distribution of addressed memory cells. The amplitude variation of the first read voltage Vmax is based on a variation of the mean estimator voltage $V_{ME}$, that is also an adaptive voltage strictly related to the actual threshold voltage distribution of the plurality of addressed memory cells.

A second read voltage 605b with different polarity is applied to differentiate logic value of memory cells that have not thresholded, yet. In some cases, as it will be explained with reference to the description of FIG. 9 below, it is may be desirable to increase the amplitude of the second read voltage 605b with respect to the amplitude of the first read voltage 603b. For example, the second read voltage 605b may be increased by a second read voltage difference $\Delta V_{R2}$ to $-Vmax-\Delta V_{R2}$, as depicted. This choice may provide more margin in allowing a reduction of the first read voltage difference $\Delta V_{R1}$ and correspondingly the possibility to further reduce the first read voltage Vmax (normally resulting in a higher number of memory cells not switching and therefore not being correctly read during the reading steps in the first polarity), while maintaining a fully reliable determination of the logic value at the end of the disclosed read sequence.

The determination is made that a memory cell has a first logic value (e.g., logic 1) based on the memory cell having switched during one of the applying the increasing read voltage 601b and the applying the first read voltage 603b or based on the memory cell not having switched during the applying the second read voltage 605b.

In other words, during the initial step an increasing read voltage 601, 601a, 601b, is applied to the memory cells. Progressively more and more memory cell threshold (e.g., switch) with the increasing read voltage being applied. A counter counts the number of switching memory cells. In some examples, the count may be used to vary a slew rate of the increasing voltage 601, 601a, 601b when the first or some of the memory cells switch, for example. In the examples depicted in FIGS. 6A and 6B, the slew rate is increased at $V_{LOW}$, that may be the voltage at which the first memory cell in the plurality of memory cells (e.g., in the addressed codeword or page) switches. Since, as described above, each codeword has a peculiar threshold voltage distribution associated to its memory cells, it is clear that voltage $V_{LOW}$ is an adaptive voltage than varies from codeword to codeword.

A variable slew rate may be useful in adapting the read sequence to each codeword and therefore more precisely and/or more quickly approaching the mean estimator voltage ($V_{ME}$) and therefore completing the read operation. The count of switched memory cells is compared to a threshold number, that may be indicative of a fraction of the number of cells in the plurality of memory cells having the first logic value; for example, the threshold number may represent 50%, or half, of the memory cells programmed in logic state 1 (that is, a true mean estimator). The threshold number of the mean estimator may correspond to other fractions or percentiles, in some examples; for example, the threshold number may be indicative of 25%, of 40%, of 60%, or of other percentages of the memory cells detected to be in the predetermined logic state.

Based on the number of switched cells satisfying the criterium (e.g., equaling or exceeding the threshold) at mean estimator voltage $V_{ME}$, the read voltage is increased by read voltage difference $\Delta V_{R1}$ to the first read voltage Vmax. It is understood that, due to intrinsic statistical fluctuations of threshold voltage distributions of memory cells in different codewords or pages, both $V_{ME}$, and Vmax are adapted to the addressed codeword or page. Accordingly, the disclosed read sequence and method have a much higher level of flexibility and faster and more reliable reading may be obtained. Read voltage difference $\Delta V_{R1}$ may be a predetermined voltage difference that may be obtained by design (possibly relying on trimmable circuits, for example at die level). The read voltage difference $\Delta V_{R1}$ may be related to an expected threshold voltage distribution width, for example as resulting from characterization results. It should be noted that the amplitude of the read voltage difference $\Delta V_{R1}$ may be such that the first read voltage (Vmax) in the same polarity as the increasing voltage is sufficiently close to most of the memory cells programmed in the predetermined logic state (e.g., with logic value 1) have threshold lower than Vmax and therefore switch when biased at Vmax. However, a good degree of tolerance is allowed. As a matter of fact, even if not all memory cells have thresholded or switched at the end of the first read voltage pulse (e.g., t0 in FIGS. 6A and 6B), the determination of the logic state is finalized with the second read voltage pulse in the opposite polarity (e.g., 605, 605a at $-Vmax$ or 605b at $-Vmax-\Delta V_{R2}$). Using a lower reading voltage (e.g., Vmax) with respect to other previous approaches that may otherwise account for full margins, induces less stress on memory cells (both addressed and not addressed) and reduced consumed energy.

It should be noted that, if an Error Correction Code (ECC) engine is available to protect the codeword or page, the reading step at the second read voltage 605 may be skipped, provided that the data at t0 (e.g., after application of the increasing read voltage 601, 601a, 601b, and the first read voltage 603, 603a, 603b) is within a correcting capability of the ECC engine.

More in detail, if an encoded codeword includes n memory cells or bits (comprising encoded user data, parity and ECC bits—reference can be made to encoded user data 315a of FIG. 3A, for example), and the ECC engine has a correction capability of two bits (e.g., up to 2 bits incorrectly read may be identified and corrected), it may occur that all, or all except one, or all except two memory cells programmed at 1 (or more generally at the first logic state) have been correctly read at time t0, e.g., during the increasing read voltage 601 (up to $V_{ME}$) and/or the step at the first read voltage 603 (Vmax). FIG. 7 below describes such a possibility. In such occurrences, the ECC engine may be able to correct the possible errors and make the reading step at the second read voltage unnecessary.

Data may be output after ECC correction without waiting to have determination of logic state of memory cells that have not switched, yet (as described above, such a determination is normally completed based on reading at the second read voltage, according to some examples). This possibility clearly depends on the actual threshold voltages of memory cells in the addressed codeword, the actual first read voltage Vmax applied in the specific case and the ECC correction power.

FIG. 7 is a diagram 700 illustrating memory cell distributions during a positive polarity read of memory cells with a read voltage of a first polarity according to examples of the present disclosure. For illustrative purposes, FIG. 7 adopts a particular programming convention that assumes access circuitry applies a positive programming pulse to program a cell to a logic 1, and a negative programming pulse to program the cell to a logic 0. However, another example can adopt the opposite programming convention (e.g., a positive programming pulse can result in a logic 0 and a negative programming pulse can result in a logic 1).

As shown in FIG. 7, for example, curve 701 may indicate memory cells programmed to be, for instance, logic 1 (e.g., programmed with a positive pulse, such as positive programming pulse 404), and curve 703 may indicate memory cells programmed to be, for instance, logic 0s (e.g., programmed with a negative pulse, such as negative programming pulse 406). In one example of the present disclosure, the read voltage may include applying an increasing read voltage 601 and a first read voltage 603 as shown and described in FIG. 6A-6B. In one example, the increasing read voltage 601 is a positive voltage ramp with variable slew-rate as mentioned above with reference to FIG. 6. In other example, the increasing read voltage 601 may be a positive staircase (see FIG. 6B). According to the example of the present disclosure, when a predetermined number of memory cells (e.g., half of the memory cells) is read during the application of the increasing read voltage 601, the first read voltage 603 may be applied increasing the read voltage by a predetermined read voltage difference $\Delta V_{R1}$ from the mean evaluator voltage VME, e.g., up to $+V\text{max}=V_{ME}+\Delta V_{R1}$. In this case, as shown in FIG. 7, memory cells with threshold voltage lower than $V_{ME}$ and memory cells with threshold voltage lower than Vmax are correctly read as logic value 1 (during the application of the increasing read voltage and of the first read voltage, respectively). However, possibly remaining memory cells programmed to a logic value 1 but with a threshold voltage higher than Vmax (e.g., cells in the high threshold voltage tail of the distribution 701, such as cells identified by points 1 and 2) cannot be read as they would not switch when biased at Vmax. It should be noted that the first read voltage Vmax may be selected to be lower than the expected highest threshold voltage of the memory cells programmed to be logic 1. Accordingly, it is expected that a number of cells programmed at logic value 1 are not identified up to this stage.

It is desirable that the first reading voltage (Vmax) be lower than an expected lowest threshold voltage of memory cells programmed in logic stat 0 (e.g., cells the threshold voltage distribution of which is represented by curve 703). Threshold voltage exhibited by memory cell identified with point 3 may be a lowest threshold voltage among cells in distribution 703. It is desirable the Vmax is lower than threshold voltage of memory cell 3, to avoid any error in assigning a logic value to it. In any case, possible residual errors may be taken into account by an Error Correction Code (ECC) engine. It may appear evident that the second read voltage (Vmax) is an adaptive voltage (it may be obtained identifying a codeword-specific mean evaluator voltage $V_{ME}$ and adding a predetermined read difference voltage $\Delta V_{R1}$ to it), so it may accurately track statistical threshold voltage variations and possible drifts of actual memory cells being addressed. The reading in first polarity ends at t0 (shown in FIG. 6).

When the memory cells switch under the application of the increasing read voltage 601 and/or the first read voltage 603 the data read from the memory cells may be latched and the corresponding memory cell may be deactivated.

In some situations, curves 701 and 703 may overlap (not explicitly shown in FIG. 7); for example it is possible that memory cells programmed to a logic value 1 (e.g., in high end tail of curve 701) exhibit a threshold voltage, when read in positive polarity, higher than a threshold voltage of other threshold cells programmed to a logic value 0 (e.g., in the low end tail of curve 703). In such circumstances it would be impossible to correctly distinguish between cells programmed to different logic states (and the correcting power of a possible ECC may not be sufficient). According the disclosed methods, the sequence comprising the increasing read voltage and the first reading voltage allows to correctly identify at least a portion of memory cells programmed to logic value 1. Afterwards, the read voltage may be inverted to a negative voltage (e.g., −Vmax (shown in FIG. 8) or −Vmax−$\Delta V_{R2}$ (shown in FIG. 9)) to perform a read with the negative voltage and complete the determination of the logic state of the memory cells.

FIG. 8 illustrates the distribution of threshold voltage magnitudes in response to a negative polarity read (for instance negative voltage), in accordance with an example. Recalling the description of FIG. 5 above, as shown in FIG. 8, for example, curve 801 may indicate memory cells programmed to have logic value 1 (e.g., programmed with a positive pulse, such as positive programming pulse 404), and curve 803 may indicate memory cells programmed to have logic value 0 (e.g., programmed with a negative pulse, such as negative programming pulse 405). The dotted portion of curve 801 corresponds of memory cells that may have switched when read in positive polarity (e.g., memory cells with threshold voltage lower than Vmax, as described in FIG. 7 above). The solid portion of curve 801 corresponds to memory cells that have not thresholded when biased at Vmax because their threshold voltage is higher, despite they may have been programmed to logic value 1 (memory cells programmed to logic value 0, in curve 803, have not thresholded either when biased at Vmax—see FIG. 7); this solid portion of curve 801 includes memory cells identified with points 1 and 2.

In one example of the present disclosure, reading under negative polarity conditions may be carried out at the second read voltage 605 (e.g., −Vmax) as shown and described in FIG. 6A or 605a as described in FIG. 6B. During the application of the second read voltage 605, 605a, memory cells identified with points 1 and 2, as well as any memory cell originally programmed at logic value 1 even if its threshold voltage is higher than Vmax when read in positive polarity, can be read correctly under negative polarity at −Vmax as they may not switch. On the contrary, the memory cells initially programmed at logic value 0, that may have not switched under positive polarity reading at Vmax (curve 703 in FIG. 7), may switch under negative polarity reading at −Vmax (curve 803). In particular, memory cell identified with point 3 may have a low (in absolute value) threshold voltage and switch. This would also be the case if the threshold voltage of memory cell 3, when read in positive polarity, had been lower than, for example, threshold voltage of memory cell 2 (refer to FIG. 7, but consider overlapping distributions), in line with the description above with reference to FIG. 5. At t1, the negative polarity read of the memory cells ends and the data read from the memory cells may be also latched.

Finally, the determination is made that a memory cell in the plurality of memory cells has a first logic value (e.g., a logic value 1) based on the memory cell having switched during one of the applying the increasing read voltage 601 and the applying the first read voltage 603 or based on the memory cell not having switched during the applying the second read voltage 605. Meanwhile, memory cells related to the plot 803 may be refreshed; in particular, the switching of memory cells programmed at logic value during the second read voltage pulse refreshes the datum stored therein. Moreover, the switching of memory cells programmed to logic value 1 (with the exception of possible memory cells identified with points 1 and 2, during the increasing read voltage and the first read voltage pulses refreshes the datum stored therein, too. Optionally, memory cells that have not thresholded (e.g., memory cells identified with points 1 and 2) may be refreshed with a dedicated programming pulse of appropriate amplitude and polarity (e.g., a positive programming pulse similar to pulse 404 in FIG. 4).

Additionally and alternatively, FIG. 9 illustrates the distribution of threshold voltage magnitudes in response to another negative polarity read (for instance at negative voltage −Vmax−$\Delta V_{R2}$), in accordance with an example. As shown in FIG. 9, for example, curve 901 may indicate memory cells programmed to have logic value 1 (e.g., programmed with a positive pulse, such as positive programming pulse 404), and curve 903 may indicate memory cells programmed to have logic value 0 (e.g., programmed with a negative pulse, such as negative programming pulse 405). Similarly to FIG. 8, the dotted portion of curve 801 corresponds to memory cells programmed in logic value 1 that may have threshold voltage lower than Vmax when read in positive polarity (e.g., cells that may have switched—see description of FIG. 7); solid portions of curves 901 and 903 correspond to memory cells that have not switched. Similar considerations regarding memory cells exhibiting threshold voltage in respective distributions (e.g., cells 1, 2 and 3 in high/low end tails of curves 701 and 703, 801 and 803, and 901 and 903) also apply in this case and are not repeated.

In one example of the present disclosure, the reading under negative voltage conditions may be carried out at the second read voltage 605b (e.g., −Vmax−$\Delta V_{R2}$) as shown and described in FIG. 6B, for example. During the application of the second read voltage 605b, memory cells identified by the points 1 and 2 can be read correctly. The choice of $\Delta V_{R1}$ (and therefore Vmax) and $\Delta V_{R2}$ may be optimized to have similar expected margins with respect to threshold voltage distributions. For example, reducing $\Delta V_{R1}$ may increase the number of memory cells programmed at logic value 1 that are initially nor correctly read; however, this may be beneficial in allowing for an increased margin with respect of memory cells programmed at logic level 0 that may have a threshold voltage in the low tail of the corresponding distribution when read in positive polarity. Moreover and in a similar fashion, tuning of $\Delta V_{R2}$ may increase the margin with respect of memory cells programmed at logic level 0 that may have a threshold voltage in the high tail of the corresponding distribution when read in negative polarity. In one example, $\Delta V_{R1}$ and $\Delta V_{R2}$ may be within a range of about 200 mV to about 700 mV, for example 500 mV.

At t1, the negative polarity read of the memory cells ends and the data read from the memory cells may be also latched. The determination is made that a memory cell in the plurality of memory cells has a first logic value (e.g., a logic value 1) based on the memory cell having switched during one of the applying the increasing read voltage 601b and the applying the first read voltage 603b or based on the memory cell not having switched during the applying the second read voltage 605b. Meanwhile, memory cells related to the plot 903 may be refreshed (e.g., under the second read voltage). Moreover, the switching of memory cells programmed to logic value 1 (with the exception of possible memory cells identified with points 1 and 2, during the increasing read voltage and the first read voltage pulses refreshes the datum stored therein, too. Optionally, memory cells that have not thresholded (e.g., memory cells identified with points 1 and 2) may be refreshed with a dedicated programming pulse of appropriate amplitude and polarity (e.g., a positive programming pulse similar to pulse 404 in FIG. 4).

Figure 10:
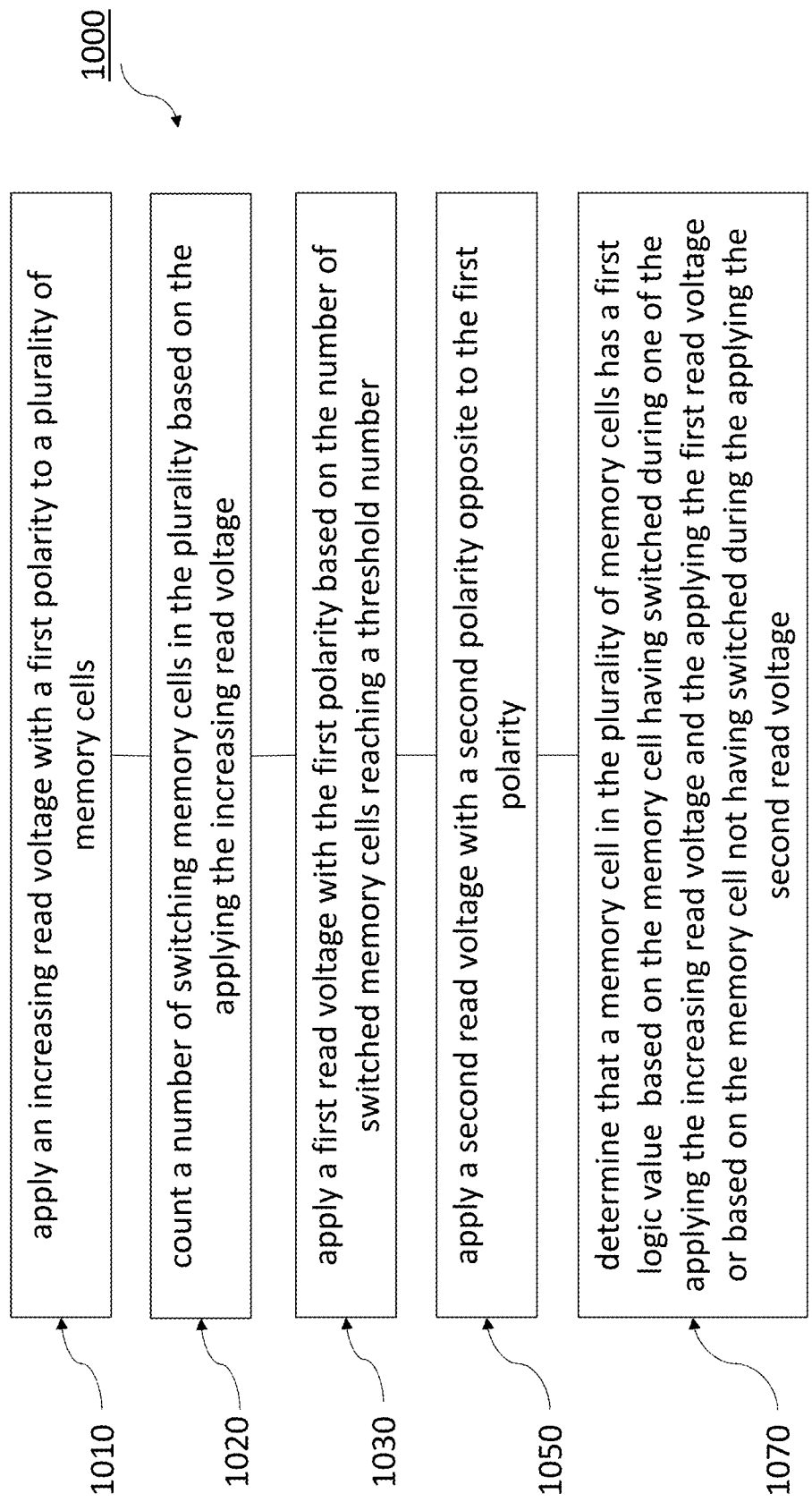
FIG. 10 is a flowchart illustrating a method for accessing memory cells according to examples of the present disclosure.

FIG. 10 is a flowchart illustrating a method 1000 for accessing memory cells according to the present disclosure. The processes described can be performed by hardware logic and circuitry. For example, the following processes are described as being performed by access circuitry and sense circuitry, such as access circuitry 143 and sense circuitry 145 of FIG. 1, as disclosed herein. However, other examples can include different circuitry configurations suitable for performing the processes.

The method of the present disclosure is a method for accessing a plurality of memory cells. Prior to reading the memory cells, access circuitry writes data to a plurality of memory cells. For example, access circuitry writes logic 0s and logic 1s to a plurality of memory cells such as the memory cell 100 of FIG. 1. In one example, access circuitry can write logic 0s by applying programming pulses with a negative polarity and logic 1s by applying programming pulses with a positive polarity (as described above with reference to FIG. 4, for example). The opposite convention can also be adopted. The programmed data may comprise user data and parity bits, as described with reference to FIG. 3; user data and parity bits (and possible patch bits) may be encoded so as to have a predetermined number or percentage of encoded bits programmed in one logic state (for example, 50% of the bits are programmed at 1). After writing data to the plurality of memory cells, access circuitry can read the plurality of memory cells using the read sequence of the present disclosure.

More in particular, at step 1010, an increasing read voltage with a first polarity may be applied to the plurality of memory cells. In one example of the present disclosure, the increasing read voltage may be a positive voltage ramp, as described with reference to FIG. 6A. In other examples, the increasing read voltage may be a positive staircase voltage ramp, as described with reference to FIG. 6B, for example, and 6B. The ramp or the staircase ramp may be negative, in some cases (e.g., it is intended that the amplitude of the read voltage increases). The increasing reading voltage may have a variable slew rate; for example a slew rate of the ramp or the staircase may change in correspondence to the first or some of the memory cells switching, as described with reference to FIGS. 6A and 6B, for example. The slew rate may increase to speed-up subsequent steps. In other examples, the slew rate may decrease and allow a finer search in subsequent steps.

At step 1020, a number of switching memory cells in the plurality may be counted based on the applying the increasing read voltage. Switching memory cells maybe identified by monitoring an electrical response to the applied read voltage. Sense circuitry (e.g., sense circuitry 145 of FIG. 1) coupled to memory cells through access lines may monitor the electrical response; a sudden current increase or voltage decrease and/or a current exceeding a current threshold may indicate that a memory cell has switched. Switching memory cells may trigger a mean estimator or a counter at each switching event. Counter 1144 described below with reference to FIG. 11 may be an example of the counter counting the number of switching memory cells. The counter may be included in a mean estimator circuit, in some examples.

At step 1030, a first read voltage with the first polarity may be applied based on the number of switched memory cells reaching a threshold number. In some examples, the threshold number may correspond to a fraction of a number of cells in the plurality of memory cells having the first logic value, for example half (or 50%) of memory cells expected to be programmed at logic value 1. In some examples, the first read voltage (Vmax) may have an amplitude, in absolute value, higher by a predetermined voltage difference ($\Delta V_{R1}$) than an amplitude of the increasing voltage ($V_{ME}$) corresponding to the number of switched memory cells reaching the threshold number. For example, Vmax=$V_{ME}$+$\Delta V_{R1}$, as described above with reference to FIGS. 6A-6B and 7, where $V_{ME}$ may correspond to a mean value in the threshold voltage distribution of addressed memory cells (e.g., the voltage for which 50% of the cells have switched) and $\Delta V_{R1}$ may be a predetermined read voltage difference related to an expected threshold voltage distribution width. $\Delta V_{R1}$ may account for 1 standard deviation (1σ), 1.5σ, 3σ or 4σ in different examples.

At step 1050, a second read voltage with a second polarity opposite to the first polarity may be applied. In some examples the second read voltage may have a same amplitude as the first read voltage (Vmax), but opposite polarity, e.g., -Vmax. In some examples the second read voltage may have a greater amplitude than the amplitude of the first read voltage (Vmax); for example the second read voltage may have amplitude |-Vmax-$\Delta V_{R2}$|, where $\Delta V_{R2}$ is a second voltage difference that may account for increased read margin with respect to expected threshold voltage of memory cells programmed in a logic state different than the first logic state when read in the second polarity (e.g., memory cells programmed at logic level 0 when read under negative polarity), as described with reference to FIG. 9, for example.

At step 1070, it may be determined that a memory cell in the plurality of memory cells has a first logic value based on the memory cell having switched during one of the applying the increasing read voltage and the applying the first read voltage or based on the memory cell not having switched during the applying the second read voltage. For example, memory cells switched during the application of the (positive) increasing read voltage are assigned a first logic value (e.g., logic value 1). Memory cells switched during the application of the (positive) first read voltage are assigned the first logic value (e.g., logic value 1). Memory cells not switched during the (negative) second read voltage are assigned the first logic value (e.g., logic value 1). Reaming memory cells may have a second logic value (e.g., logic value 0) different from the first logic value.

An Error Correction Code (ECC) engine may be provided to protect data stored in the memory cells; the ECC may be used to correct possible errors during reading of the plurality of memory cells and, in some examples, an ECC scrub list may be updated after the applying the second read voltage based on the protecting with the ECC. In some cases, application of the second read voltage may be omitted, if the correcting power of the ECC is equal or higher than a number of errors after the first read voltage has been applied (e.g., in case the ECC is able to identify and correct all possible errors in a codeword or page, the errors corresponding to memory cells the logic state of which has not been correctly determined, yet, such as bits programmed at 1 that have not switched at Vmax and may temporarily be assigned an incorrect logic value 1).

In one example of the present disclosure, a logic value of respective memory cells can be determined based on the electrical responses of memory cells to the increasing read voltage, the first read voltage, and the second read voltage.

According to the example of the present disclosure, the threshold number may be a predetermined number corresponding to half of a number of bits in the user data having the first logic value, e.g., logic value 1. In one example, a count data corresponding to the number of bits in the user data having the first logic value may be stored in a counter (e.g., a codeword or page counter) associated to the plurality of memory cells. The codeword or page counter may be balanced according to a balancing scheme so that it includes a known predetermined number of bits exhibiting the first logic value, the balancing scheme comprising manipulating the counter with extra bits.

In one example of the present disclosure, the user data may be encoded in a codeword with a number of bits exhibiting the first logic value in a range, and the encoding of the user data comprises manipulating the codeword to constrain the number of bits exhibiting the first logic value in the range. In one example, the encoded user data may have substantially a same number of bits exhibiting the first logic value and the second logic value.

In one example of the present disclosure, the first polarity may be positive, the second polarity may be negative, and the second read voltage may have a same amplitude as that of the first read voltage. Additionally and alternatively, in another example, the second read voltage may have a greater amplitude than that of the first read voltage. In one example, the difference therebetween may be within a range of about 200 mV to about 700 mV, for example, about 500 mV.

In one example, memory cells switching during the application of the increasing read voltage and the first read voltage may be deactivated. For example they may be deactivated during subsequent steps and in particular during the application of the second read voltage. The corresponding memory cells may be disconnected with the sense circuit in some examples.

In one example, the user data may be protected using an Error Correction Code (ECC). In one example, an ECC scrub list may be updated after the application of the second read voltage.

In one example, memory cells may exhibit, when read in a first polarity, a threshold voltage with a lower magnitude when the memory cells have the first logic value, and a threshold voltage with a higher magnitude when the memory cells have the second logic value, and wherein a logic value of a given cell may be determined based on whether the memory cell exhibits a higher or lower magnitude threshold voltage in response to the applied read voltage (e.g., whether it switches or not).

Figure 11:
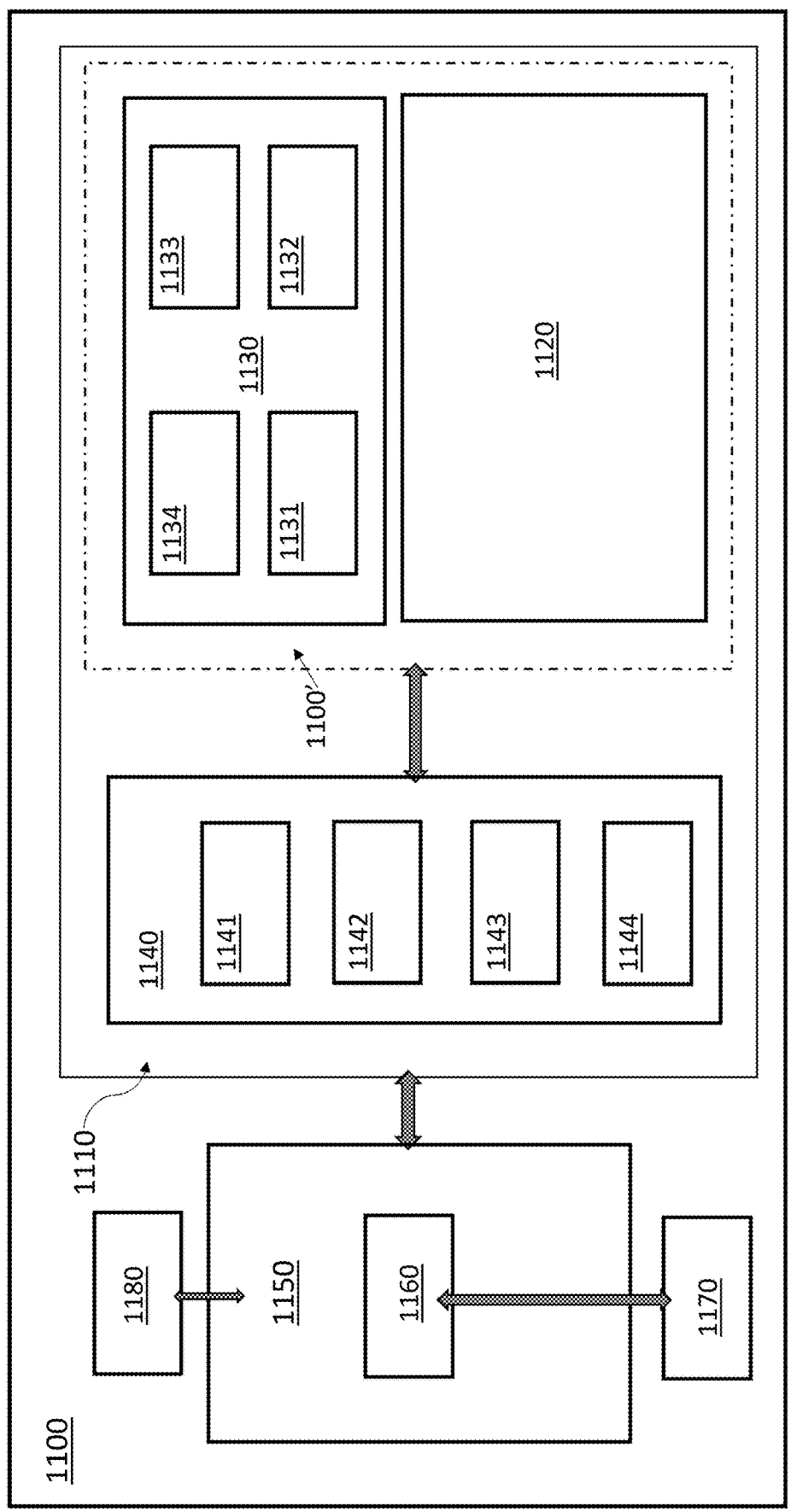
FIG. 11 is a diagram illustrating a system for accessing memory cells according to examples of the present disclosure.

FIG. 11 is a high-level scheme of a system 1100 that can perform the read sequence of the present disclosure. The system 1100 includes a memory device 1110 in turn including an array of memory cells 1120 and a circuit 1130 operatively coupled to the array of memory cells 1120; the array of memory cells 1120 and the circuit 1130 form a memory portion, herein referred to as memory portion 1100'.

The memory device 1110 comprises a memory controller 1140, which represents control logic that generates memory access commands, for example in response to command by a host device 1150. Memory controller 1140 accesses memory portion 1100'. In one example, memory controller 1140 can also be implemented in the host device 1150, in particular as part of a host processor 1160, even if the present disclosure is not limited by a particular architecture. The controller 1140 can include an embedded firmware and is adapted to manage and control the operation of the memory portion 1100'.

In general, the memory controller 1140 may receive user data through input/output (IO). As shown before, in some examples, the memory controller encodes the user data to satisfy a condition prior to storing the user data in memory cells. The condition may be satisfied when encoded user data have a predetermined number of bits exhibiting a given logic value (e.g., a logic value of 1). As a way of example, the encoded user data may be configured to have 50% of the memory cells storing the encoded user data to exhibit the logic state of 1 while the other 50% of the memory cells to exhibit a logic state of 0 (i.e. the balanced encoding scheme, where half of the encoded user data bits have a logic state of 1, and the other half have a logic state of 0). During the encoding process, the memory controller 140 may add a certain number of bits (e.g., parity bits) to the user data to establish the predetermined number of memory cells to exhibit the given logic state. As a result of adding the parity bits, the encoded user data may have more bits than the user data. In some examples, a different percentage value or percentile (e.g., 40%, 60%, 75%, or the percentage value being in a range, e.g., 48%-50%, 40%-48%, >25%, etc.) of the memory cells exhibiting the logic state of 1 may be employed during the encoding process.

The memory device 1110 can also comprise other components, such as processor units coupled to the controller 1140, antennas, connection means (not shown) with the host device, and the like.

Multiple signal lines couple the memory controller 1140 with the memory portion 1100'. For example, such signal lines may include clock, command/address and write data (DQ), read DQ, and zero or more other signal lines. The memory controller 1140 is thus operatively coupled to the memory portion 1100' via suitable buses.

The memory portion 1100' represents the memory resource for the system 1100. In one example, the array of memory cells 1120 is managed as rows of data, accessed via wordline (rows) and bitline (individual bits within a row) control. In one example, the array 1120 of memory cells includes a 3D cross-point array such as the memory cell array 200 of FIG. 2. The array 1120 of memory cells can be organized as separate channels, ranks, and banks of memory. Channels are independent control paths to storage locations within memory portion. Ranks refer to common locations across multiple memory devices (e.g., same row addresses within different devices). Banks refer to arrays of memory locations within a memory device. In one example, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

The memory controller is configured to apply an increasing read voltage with a first polarity to the plurality of memory cells. The memory controller is further configured to count a number of switching memory cells in the plurality based on the applying the increasing read voltage. The memory controller is further configured to apply a first read voltage with the first polarity based on the number of switched memory cells reaching a threshold number. The memory controller is further configured to apply a second read voltage with a second polarity opposite to the first polarity. The memory controller is further configured to determine that a memory cell in the plurality of memory cells has a first logic value based on the memory cell having switched during one of the applying the increasing read voltage and the applying the first read voltage or based on the memory cell not having switched during the applying the second read voltage.

In one example, the memory controller 1140 includes refresh (REF) logic 1141. In one example, refresh logic 1141 indicates a location for refresh, and a type of refresh to perform. Refresh logic 1141 can trigger self-refresh within memory, and issue external refreshes by sending refresh commands to trigger the execution of a refresh operation.

In one example, access circuitry 1131 of the circuit 1130 performs a refresh (e.g., reprogramming) of any of the accessed memory cells that were not refreshed during the read sequence. Therefore, a complete refresh of memory cells can be achieved as mostly a side effect of the memory read sequence with minimal additional refresh operations.

In an example, the circuit can also be embedded in the memory controller, even if the present disclosure is not limited by a particular architecture.

In the example illustrated in FIG. 11, the memory controller 1140 includes error correction circuitry 1142. The error detection/correction circuitry 1142 can include hardware logic to implement an error correction code (ECC) to detect errors occurring in data read from memory portion. In one example, error detection/correction circuitry 1142 also corrects errors (up to a certain error rate based on the implemented ECC code). However, in other examples, error detection/correction circuitry 1142 detects but does not correct errors.

In the illustrated example, the memory controller 1140 includes command (CMD) logic 1143, which represents logic or circuitry to generate commands to send to memory portion. The memory controller 1140 may also include a counter 1144, such as the mean estimator counter disclosed above and configured to count the number of bits switched during the read operation. Clearly, also other architectures can be employed, for example the counter can be embedded in the host device 1150 or also in the circuit 1130.

Based on the received command and address information, access circuitry 1131 of the circuit 1130 performs operations to execute the commands, such as the read operation of the present disclosure. In one such example, the circuit 1130 includes sense circuitry 1132 to detect electrical responses of the one or more memory cells to the applied read voltage. In one example, the sense circuitry 1132 include sense amplifiers. FIG. 11 illustrates the access circuitry 1131 and sense circuitry 1132 as being embedded in the memory portion 1100', however, other examples can include access circuitry and/or sense circuitry that is separate from the memory portion 1100'. For example, access circuitry and sense circuitry can be included in a memory controller such as the memory controller 1140.

Sense circuitry may be configured to detect a current through a given memory cell in response to the read voltage, wherein the access circuitry is configured to determine that the given memory cell is in the first logic state based on detection that a magnitude of the current is greater than or equal to a threshold current.

In one example, memory portion 1100' includes one or more registers 1133. The registers 1133 represent one or more storage devices or storage locations that provide configuration or settings for the operation of the memory portion. Furthermore, in one example, the circuit 1130 includes also decode circuitry 1134.

The host device 1150 is a computing device in accordance with any example described herein, and can be a laptop computer, a desktop computer, a server, a gaming or entertainment control system, a scanner, copier, printer, routing or switching device, embedded computing device, or other electronic device such as a smartphone. The memory device 1110 may also be embedded in the host device 1150.

In one example, the system 1100 includes an interface 1170 coupled to the processor 1160, which can represent a higher speed interface or a high throughput interface for system components featuring higher bandwidth connections, and/or graphics interface components. Graphics interface interfaces to graphics components for providing a visual display to a user of system 1100. In one example, graphics interface generates a display based on data stored in the memory device or based on operations executed by processor or both.

The system may also comprise network interface 1180 communicatively coupled to the host or to memory device for example for connecting with other systems, and/or a battery coupled to provide power to said system.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the examples of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific examples shown. This disclosure is intended to cover adaptations or variations of one or more examples of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method for accessing a plurality of memory cells comprising:
    applying an increasing read voltage with a first polarity to the plurality of memory cells;
    counting a number of switched memory cells in the plurality based on the applying the increasing read voltage;
    applying a first read voltage with the first polarity based on the number of switched memory cells reaching a threshold number;
    applying a second read voltage with a second polarity opposite to the first polarity; and
    determining that a memory cell in the plurality of memory cells has a first logic value based on the memory cell having switched during one of the applying the increasing read voltage and the applying the first read voltage or based on the memory cell not having switched during the applying the second read voltage.

2. The method of claim 1, wherein the threshold number corresponds to a fraction of a number of cells in the plurality of memory cells having the first logic value.

3. The method of claim 2, wherein the threshold number corresponds to half of the number of memory cells in the plurality of memory cells having the first logic value.

4. The method of claim 1, wherein the threshold number is a fraction of a number of memory cells in the plurality of memory cells having the first logic value, the number of memory cells stored in a counter associated with the plurality of memory cells.

5. The method of claim 1, further comprising:
    encoding information in the plurality of memory cells with a number of memory cells exhibiting the first logic value in a range.

6. The method of claim 5, wherein encoding comprises:
    encoding the information with a same number of memory cells exhibiting the first logic value and a second logic value.

7. The method of claim 5, further comprising:
    decoding the information based on the determined logic value for each memory cell in the plurality of memory cells.

8. The method of claim 1, wherein the applying the increasing read voltage comprises:
    applying a voltage staircase or a voltage ramp.

9. The method of claim 8, wherein the applying the increasing read voltage comprises:
    varying a slew rate of the voltage staircase or the voltage ramp.

10. The method of claim 1, wherein the first read voltage comprises an amplitude that is higher than an amplitude of the increasing read voltage corresponding to the number of switched memory cells reaching the threshold number.

11. The method of claim 10, wherein the second read voltage has a same amplitude as the amplitude of the first read voltage.

12. The method of claim 10, wherein the second read voltage has a greater amplitude than the amplitude of the first read voltage.

13. The method of claim 1, further comprising:
    deactivating memory cells switched during the applying the increasing read voltage and the first read voltage.

14. The method of claim 1, further comprising:
    protecting the plurality of memory cells with an Error Correction Code (ECC).

15. The method of claim 14, further comprising:
    updating an ECC scrub list after the applying the second read voltage based on the protecting with the ECC.

16. A system for accessing memory cells comprising:
    a memory comprising a plurality of memory cells; and
    a circuit communicatively coupled with the plurality of memory cells, the circuit comprising:
        sense circuitry to detect an electrical response of the plurality of memory cells to an increasing read voltage with a first polarity, a first read voltage with the first polarity, and a second read voltage with a second polarity different from the first polarity; and
        access circuitry configured to:
            apply the increasing read voltage to the plurality of memory cells;
            count a number of switched memory cells in the plurality based on the applied increasing read voltage;
            apply the first read voltage based on the number of switched memory cells reaching a threshold number;

apply the second read voltage; and
determine a logic value of respective memory cells based on electrical responses of the respective memory cells to the increasing read voltage, the first read voltage, and the second read voltage.

17. The system of claim 16, wherein, the access circuitry is configured to:
determine that, in the plurality of memory cells, memory cells switched during the application of the increasing read voltage and the first read voltage, and memory cells not switched during application of the second read voltage have a first logic value, and remaining memory cells are determined to have a second logic value different from the first logic value.

18. The system of claim 16, wherein the threshold number corresponds to half of a number of memory cells in the plurality of memory cells having a first logic value.

19. The system of claim 16, wherein a count value corresponding to a number of memory cells having a first logic value is stored in a counter associated with the plurality of memory cells and the threshold number is a fraction of the count value stored in the counter.

20. The system of claim 16, wherein the access circuitry is configured to encode information in the plurality of memory cells with a number of memory cells exhibiting a first logic value in a range.

21. The system of claim 20, wherein the encoded information has a same number of memory cells exhibiting the first logic value and a second logic value.

22. The system of claim 16, wherein the access circuitry is configured to apply the increasing read voltage as a voltage staircase or a voltage ramp with variable slew-rate.

23. The system of claim 16, wherein the access circuitry is configured to:
apply the first read voltage with an amplitude that is higher than an amplitude of the increasing read voltage corresponding to the number of switched memory cells reaching the threshold number.

24. The system of claim 23, wherein the access circuitry is configured to:
apply the second read voltage with a same amplitude as the amplitude of the first read voltage.

25. The system of claim 23, wherein the access circuitry is configured to:
apply the second read voltage with a greater amplitude than the amplitude of the first read voltage.

26. The system of claim 16, wherein the access circuitry is configured to:
deactivate memory cells switched during the application of the first read voltage and the increasing read voltage.

27. The system of claim 16, further comprising an Error Correction Code (ECC).

28. The system of claim 16, configured to update an ECC scrub list after the application of the second read voltage.

* * * * *